(12) United States Patent
Klinkman

(10) Patent No.: US 8,408,199 B1
(45) Date of Patent: Apr. 2, 2013

(54) SOLAR REFLECTOR, COLLECTING WINDOW AND HEAT STORAGE

(75) Inventor: Paul M. Klinkman, Providence, RI (US)

(73) Assignee: Paul M. Klinkmon, Providence, RI (US)

( * ) Notice: Subject to any disclaimer, the term of this patent is extended or adjusted under 35 U.S.C. 154(b) by 1064 days.

(21) Appl. No.: 12/214,451

(22) Filed: Jun. 19, 2008

Related U.S. Application Data

(60) Provisional application No. 60/944,902, filed on Jun. 19, 2007.

(51) Int. Cl.
*F24J 2/46* (2006.01)

(52) U.S. Cl. ........ 126/621; 126/685; 126/692; 126/684; 126/651; 126/571; 126/600; 126/633

(58) Field of Classification Search .................. 126/621, 126/685, 692, 684, 651, 571, 600, 633
See application file for complete search history.

(56) References Cited

U.S. PATENT DOCUMENTS

| | | | | |
|---|---|---|---|---|
| 2,559,870 A * | 7/1951 | Gay | ................................ | 165/49 |
| 4,050,777 A * | 9/1977 | Peters | ........................... | 359/853 |
| 4,111,360 A * | 9/1978 | Barr | ............................... | 126/628 |
| 4,149,520 A * | 4/1979 | Arent | ............................. | 126/633 |
| 4,192,291 A * | 3/1980 | Arent | ............................. | 126/633 |
| 4,193,390 A * | 3/1980 | Hatten | .......................... | 126/628 |
| 4,198,953 A * | 4/1980 | Power | ........................... | 126/617 |
| 4,217,742 A * | 8/1980 | Evans | ............................. | 52/553 |
| 4,219,008 A * | 8/1980 | Schultz | ......................... | 126/592 |
| 4,242,833 A * | 1/1981 | Maes, Jr. | .......................... | 47/17 |
| 4,257,400 A * | 3/1981 | Brumbaugh | .................. | 126/621 |
| 4,266,179 A * | 5/1981 | Hamm, Jr. | .................... | 322/2 R |
| 4,351,588 A * | 9/1982 | Zullig | ........................... | 359/592 |
| 4,374,631 A * | 2/1983 | Barnes | ........................... | 416/23 |
| 4,387,704 A * | 6/1983 | Minden | .......................... | 126/641 |
| 4,398,530 A * | 8/1983 | Saunders | ....................... | 126/572 |
| 5,488,801 A * | 2/1996 | Nix | ..................................... | 47/60 |
| 2005/0034751 A1* | 2/2005 | Gross et al. | .................... | 136/246 |
| 2006/0096586 A1* | 5/2006 | Hayden | .......................... | 126/600 |

* cited by examiner

*Primary Examiner* — Avinash Savani

(57) ABSTRACT

A linear trough concentrates sunlight through a long target window in a greenhouse's roof or north wall. Heat is stored in a geothermal heat bank below the greenhouse's center, where a thermal skirt around the greenhouse reduces heat loss.

7 Claims, 29 Drawing Sheets

A clerestory roof and reflector

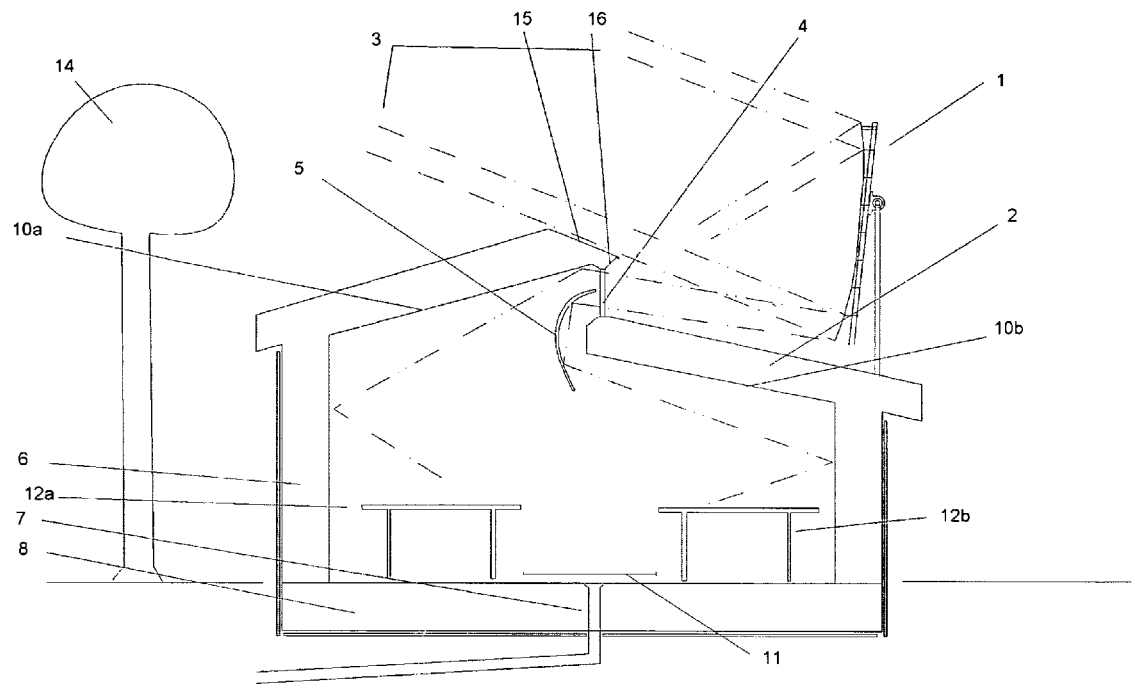
Figure 1: A clerestory roof and reflector

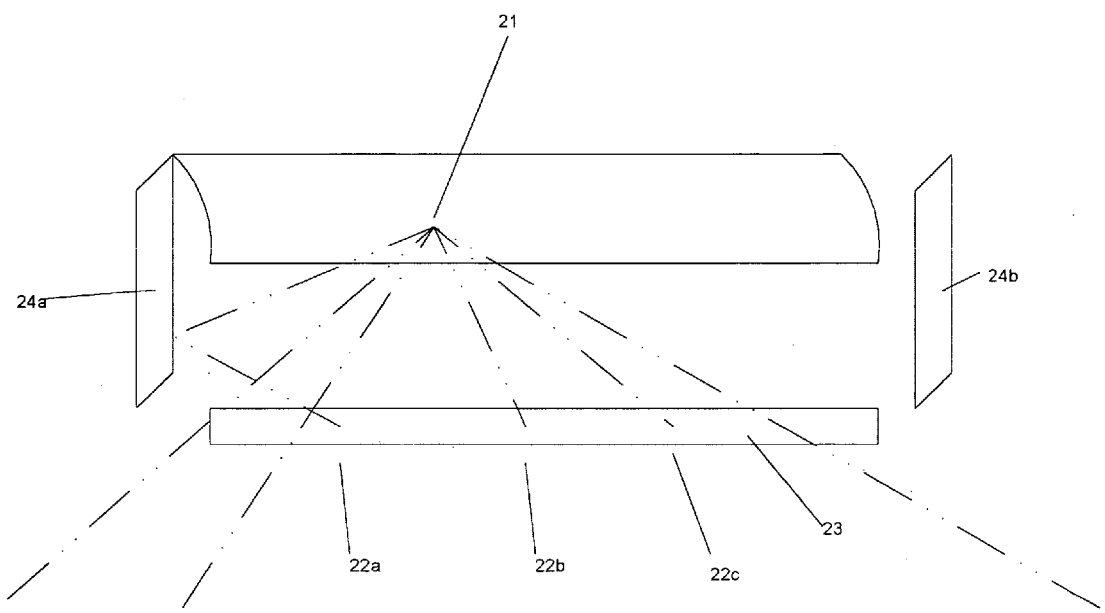
Figure 2: A reflected point focusing on a target line

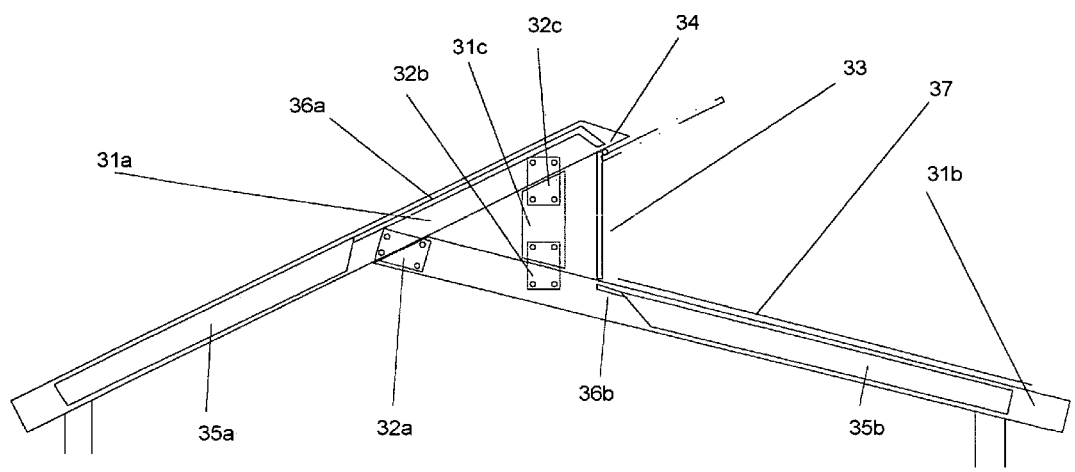
Figure 3: A scissors joint

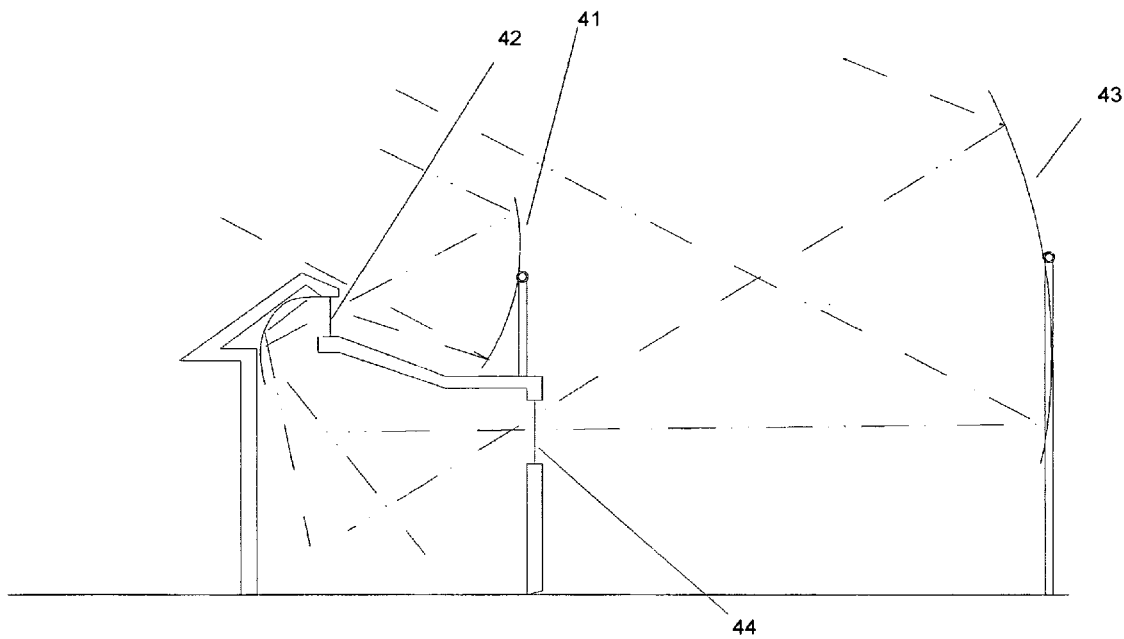
Figure 4: A combined clerestory roof and north wall solar installation

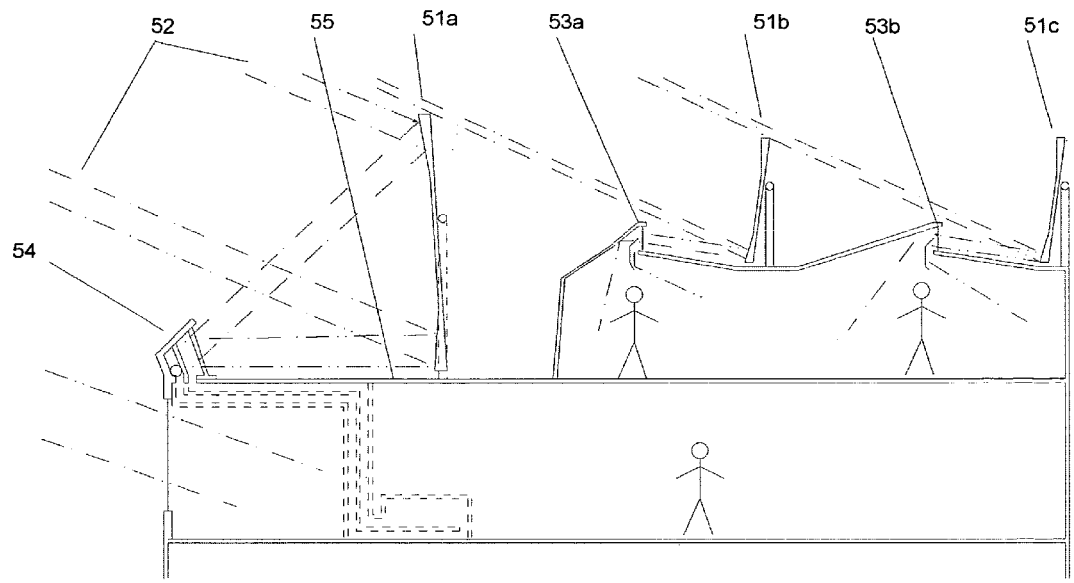
Figure 5: A combined heating and solar daylighting application

Figure 6: A combined heating and solar daylighting application in profile
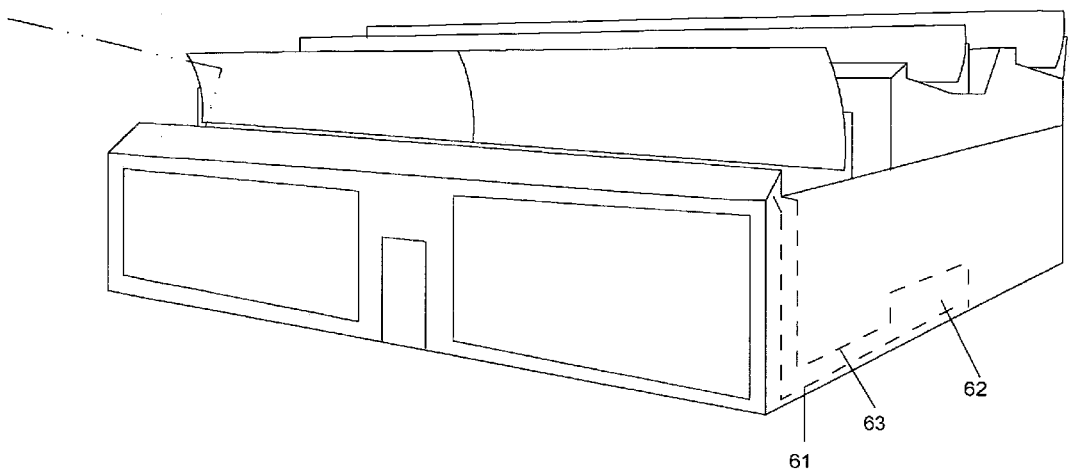

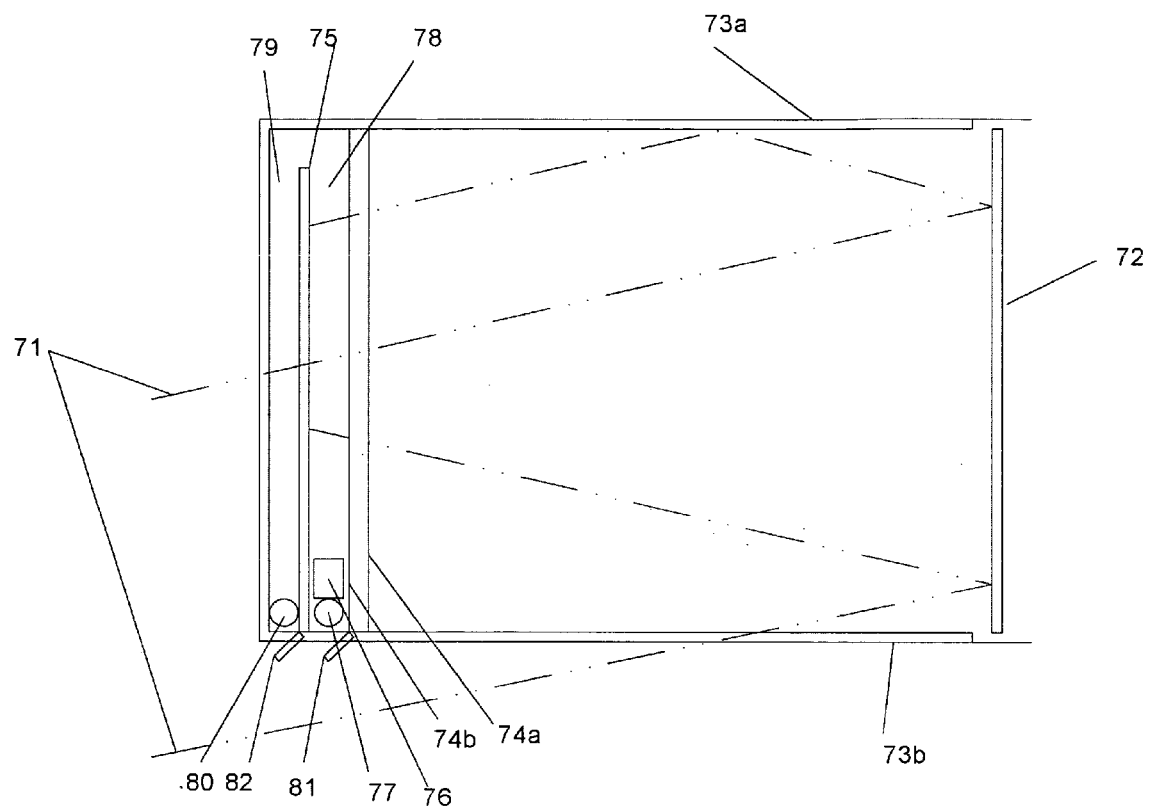
Figure 7: A top view of a photovoltaic application

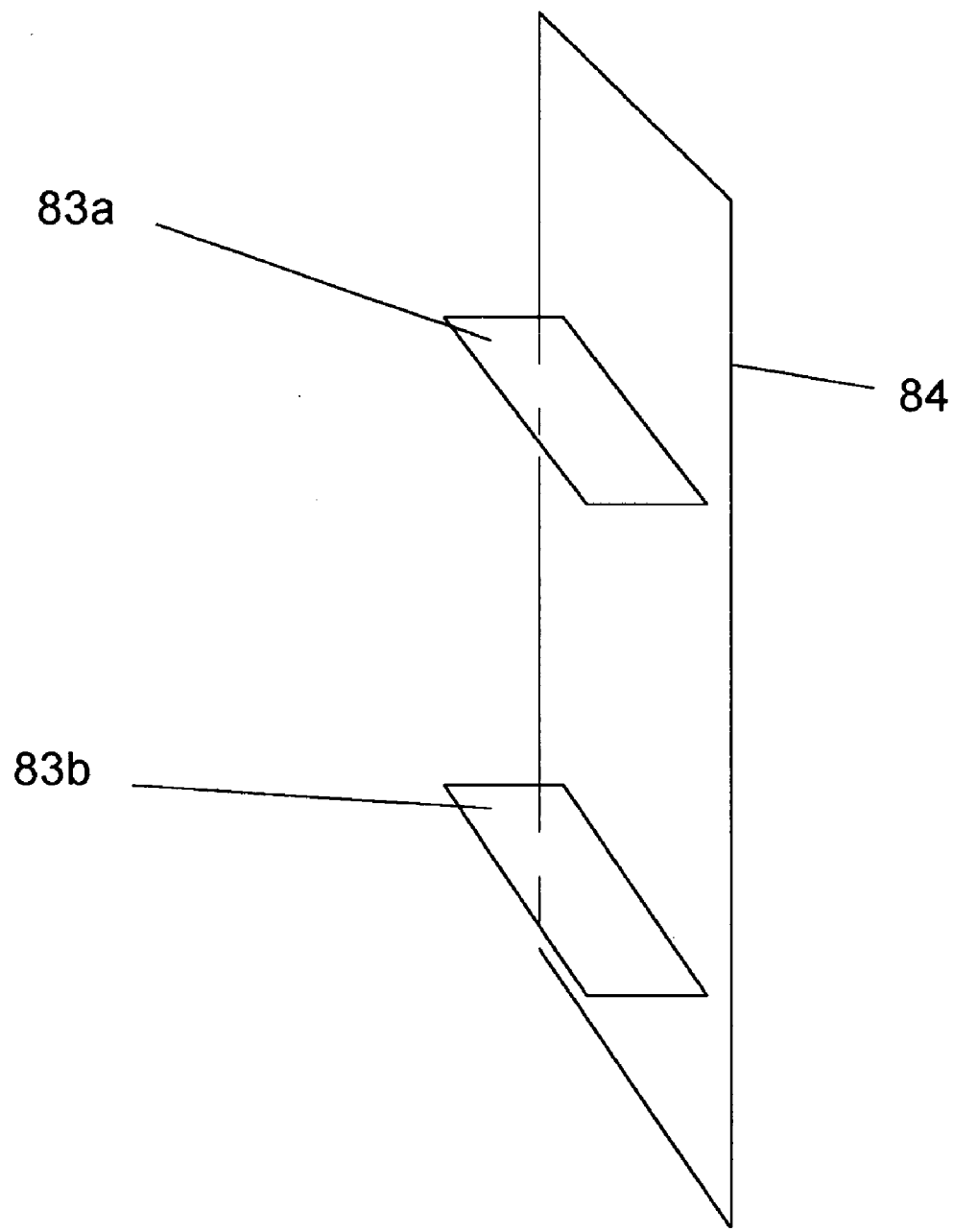
Figure 8: Heat fins on a photovoltaic panel

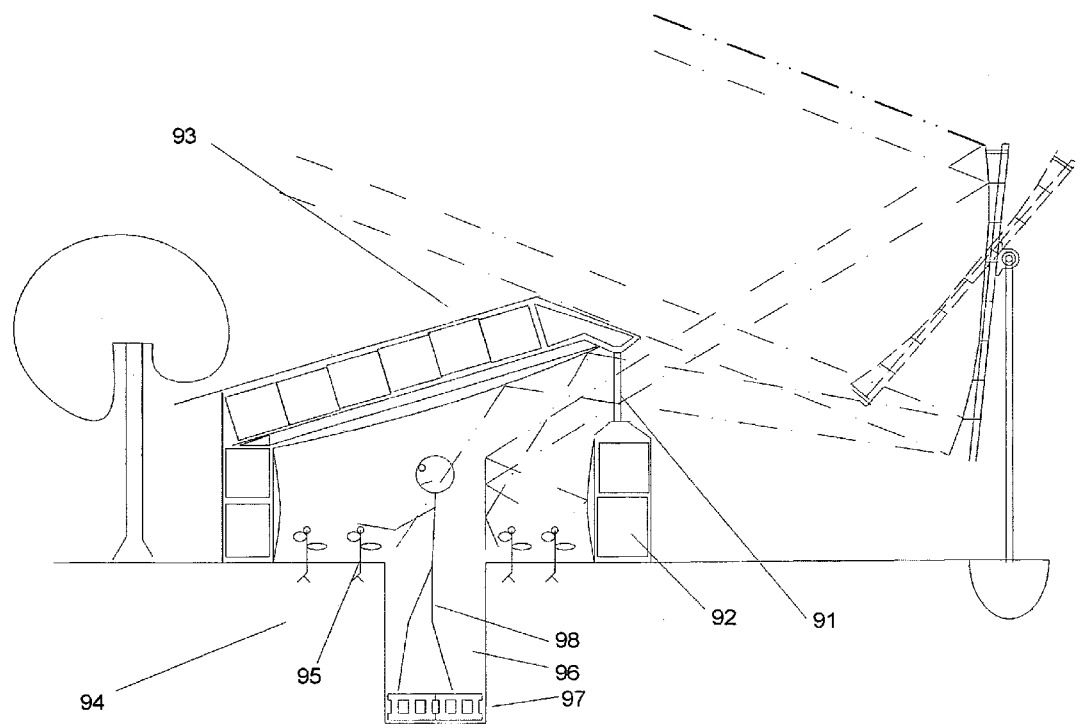
Figure 9: A greenhouse with a trench

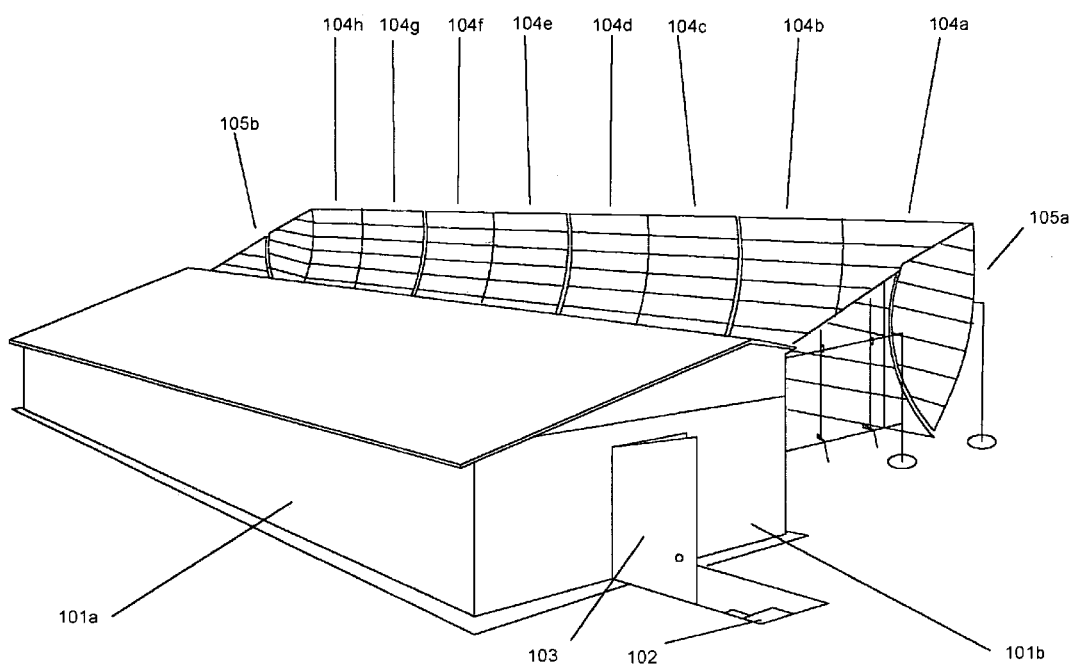
Figure 10: A greenhouse with a trench in profile

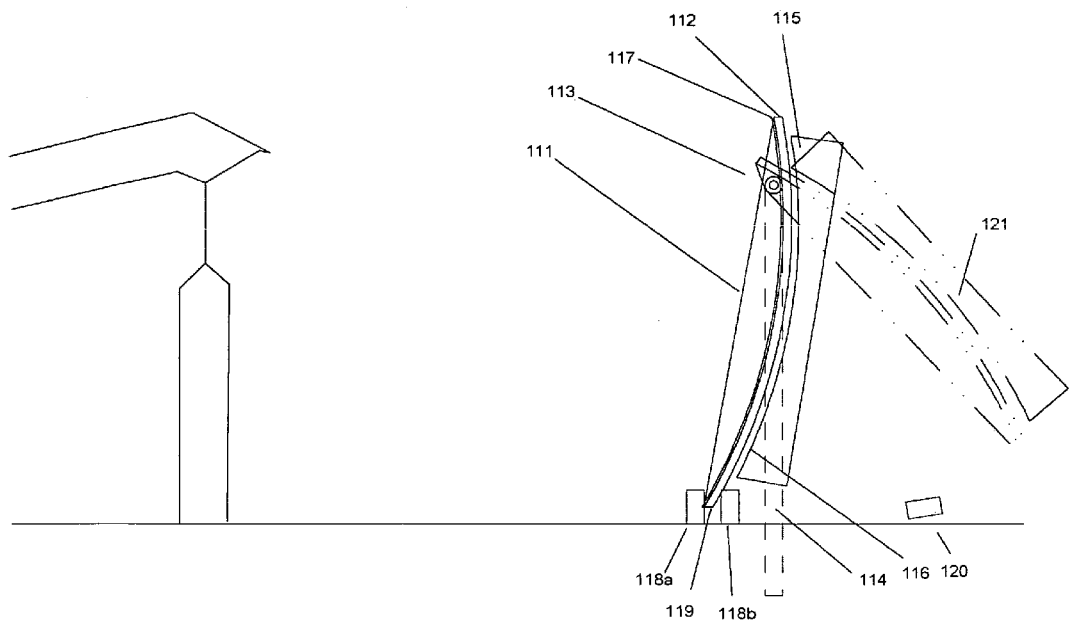
Figure 11: A reflector with an indeterminate pivot point

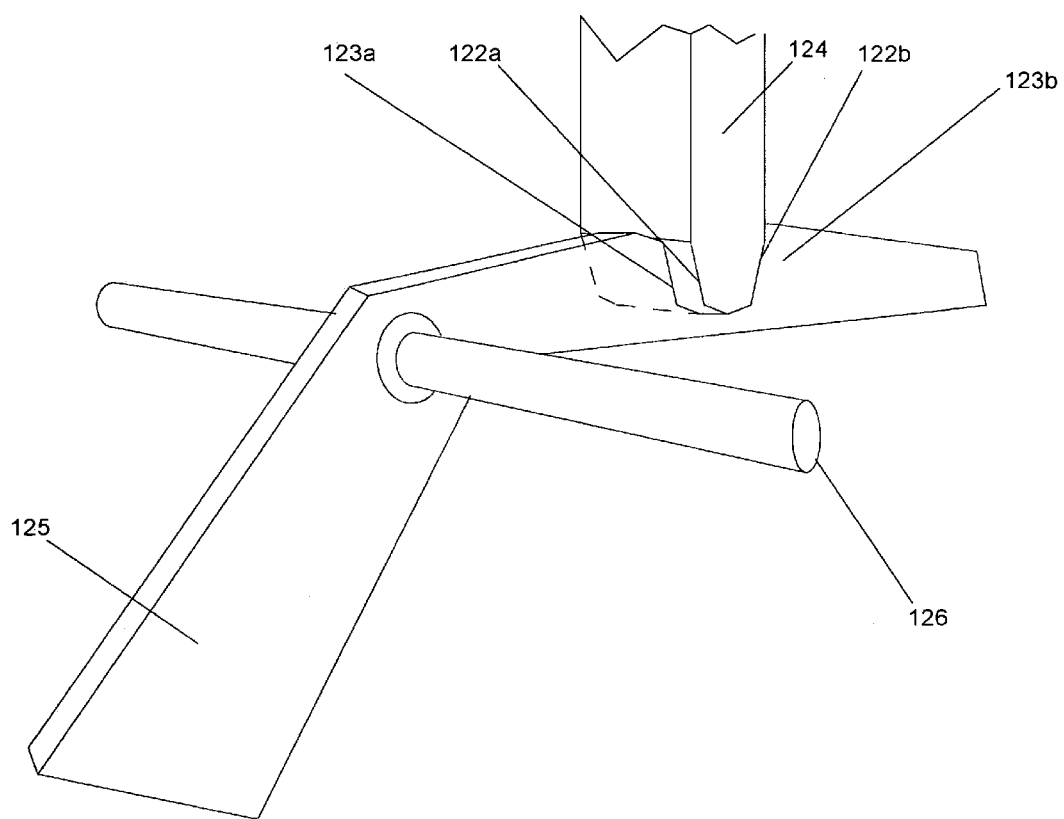
Figure 12: A latching mechanism in perspective

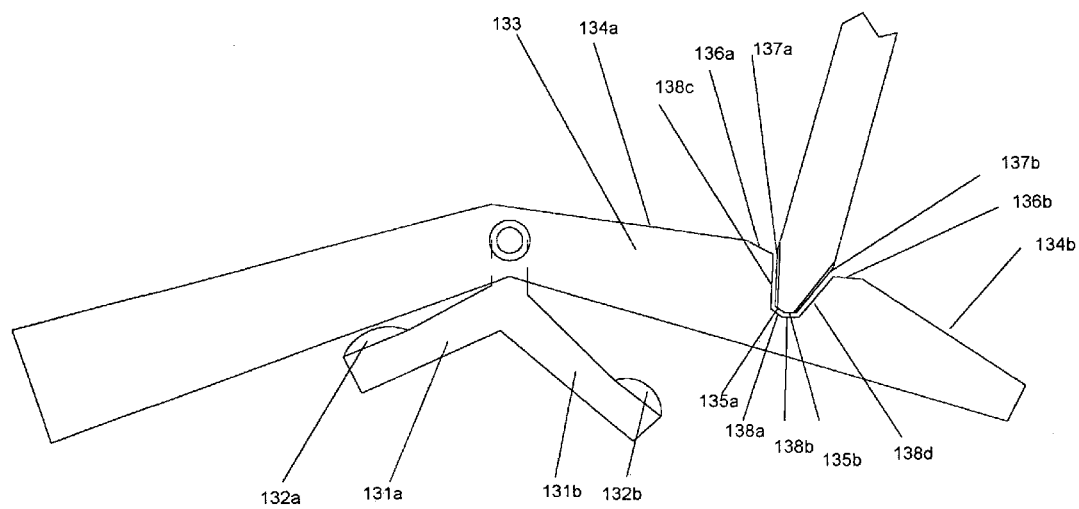
Figure 13: A latching mechanism

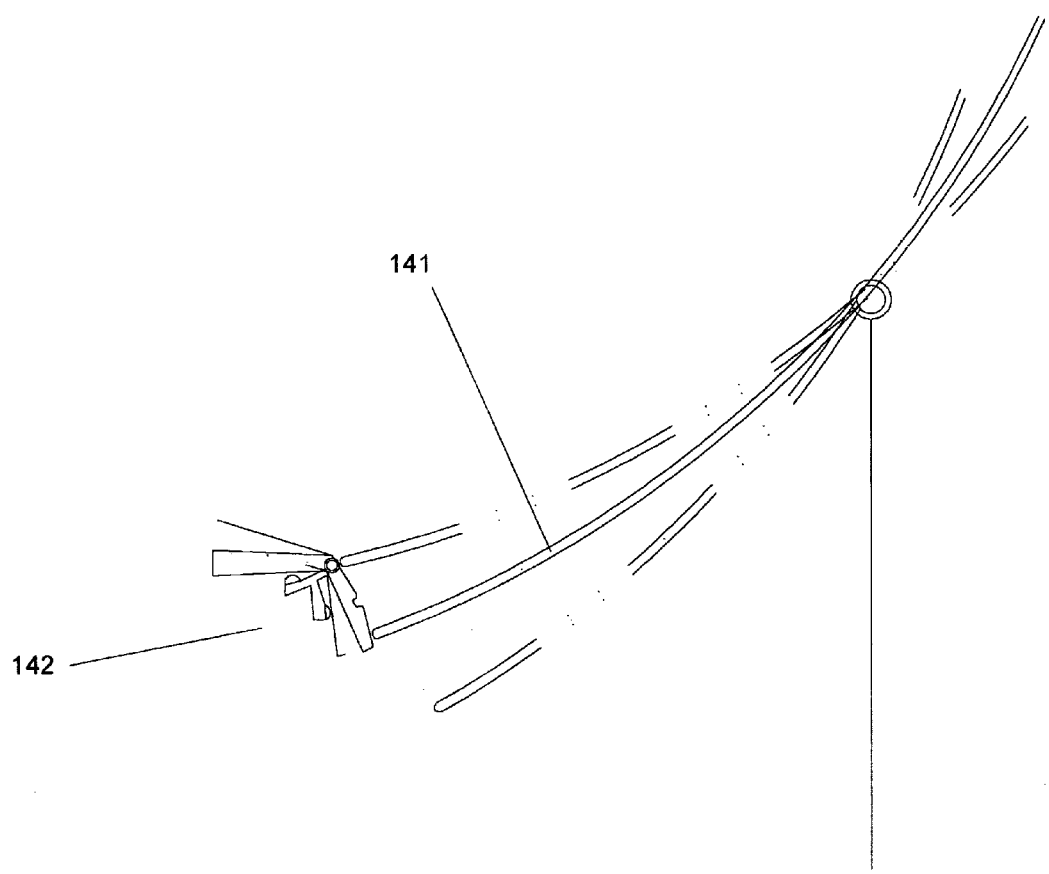
Figure 14: An interaction between a reflector and a latching mechanism

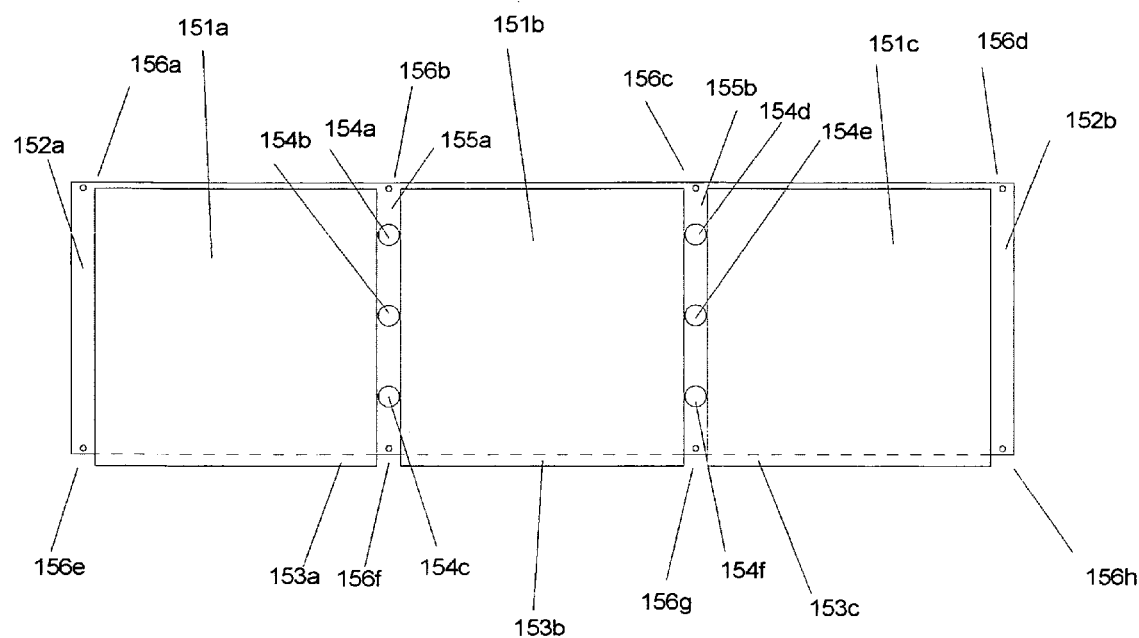
Figure 15: A section of reflectors with wind holes

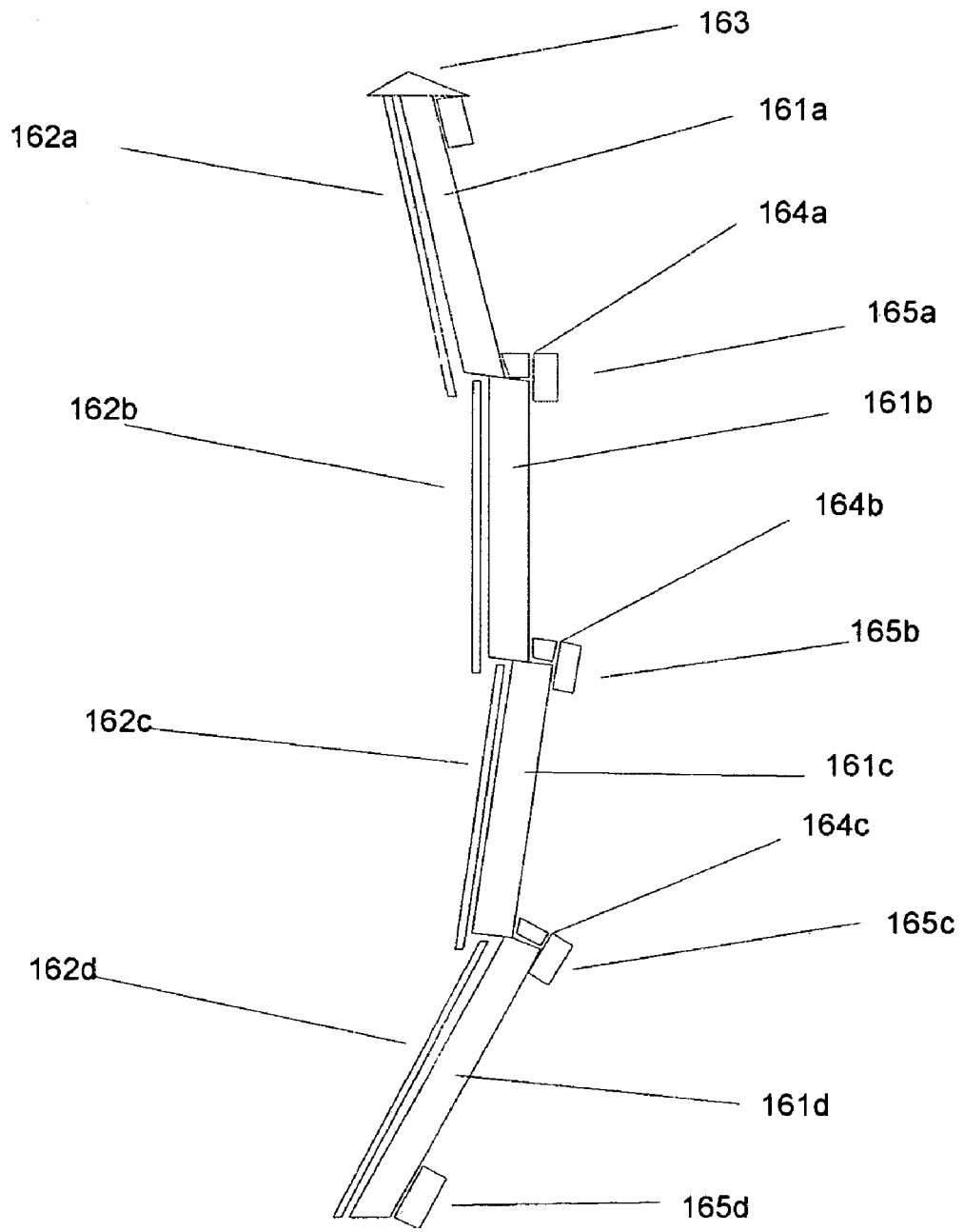
Figure 16: A shingled reflector design

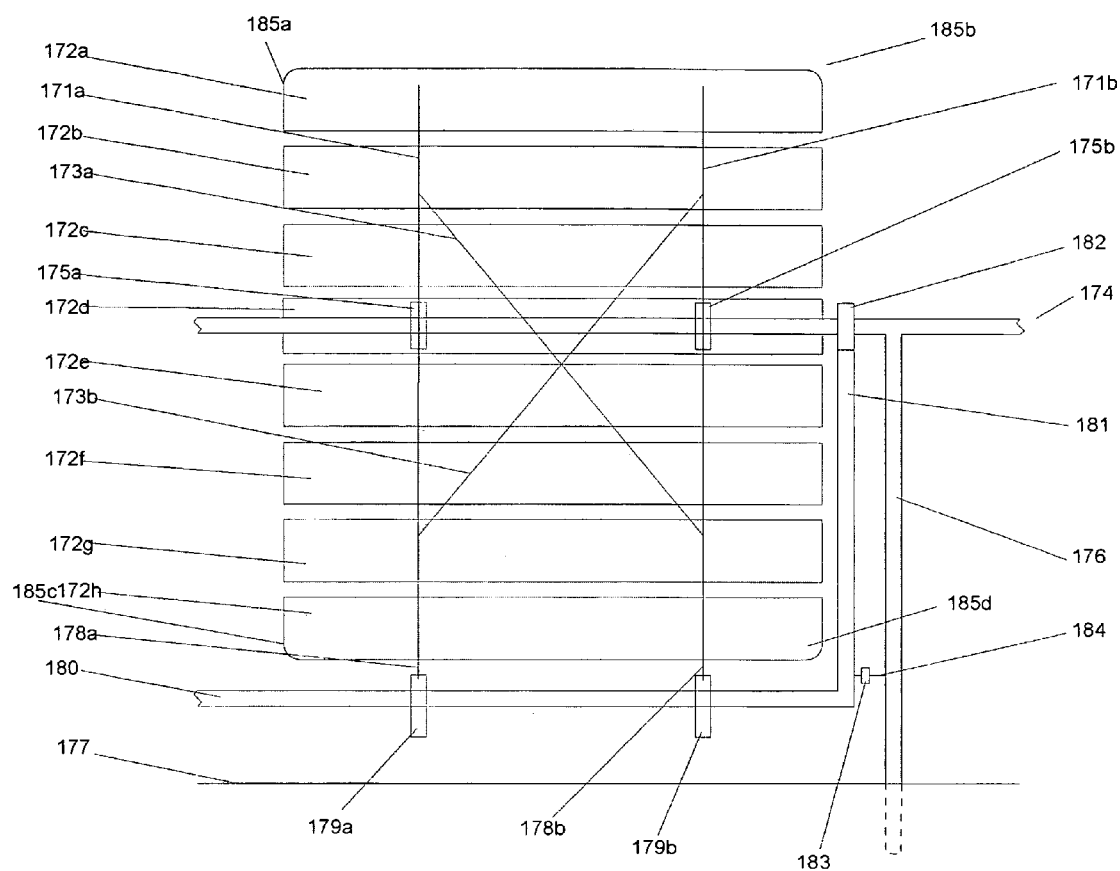
Figure 17: A reflector structure

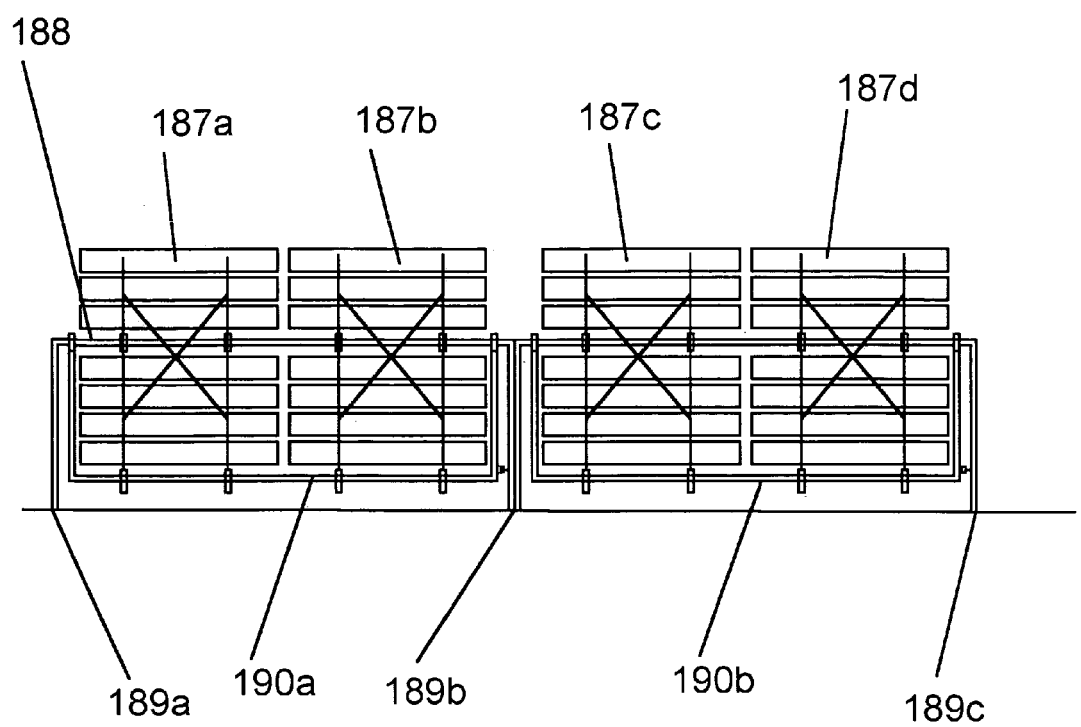
Figure 18: A multiple reflector structure

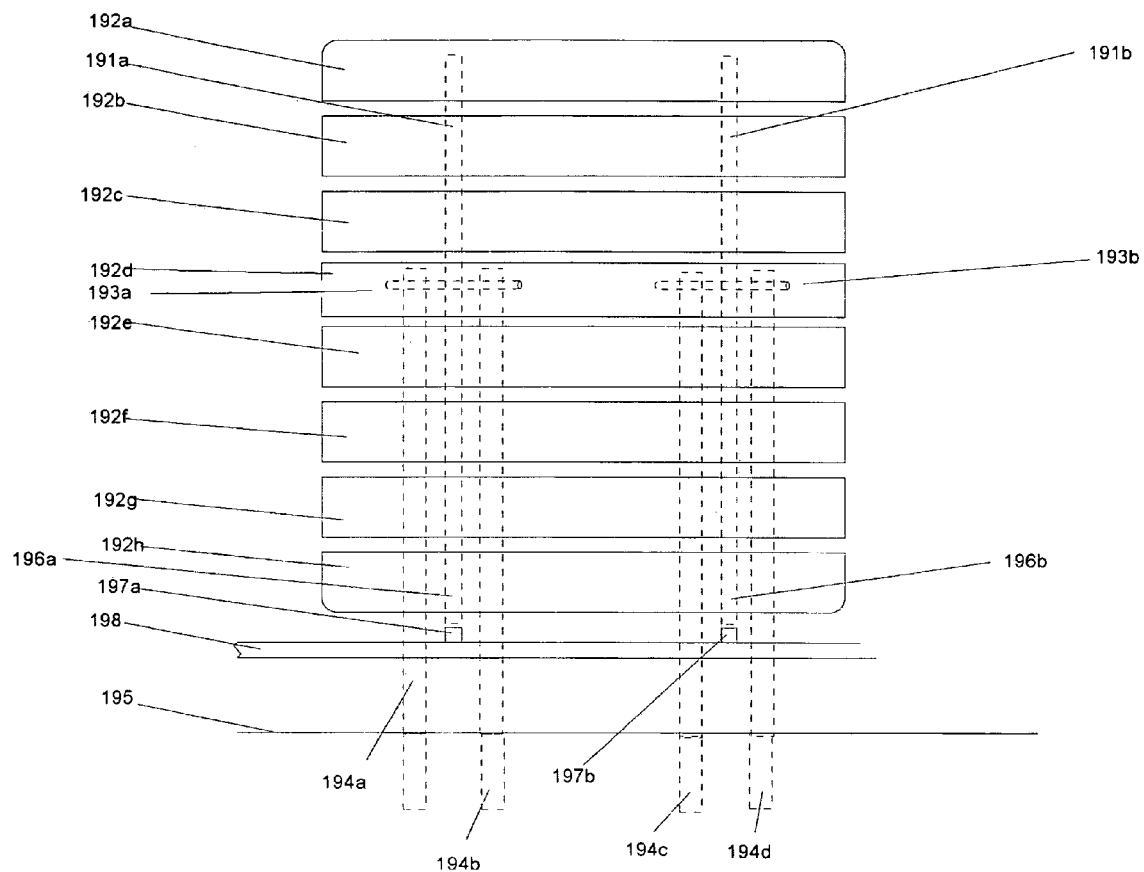
Figure 19: A wooden reflector structure

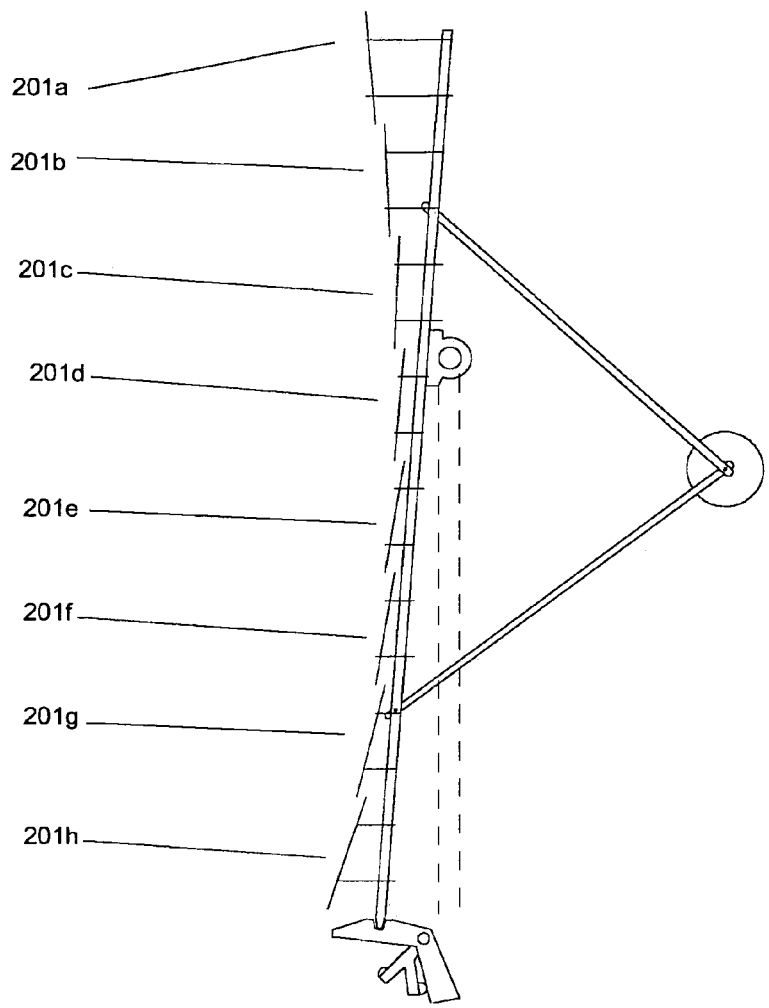
Figure 20: A reflector structure which minimizes wind pressure

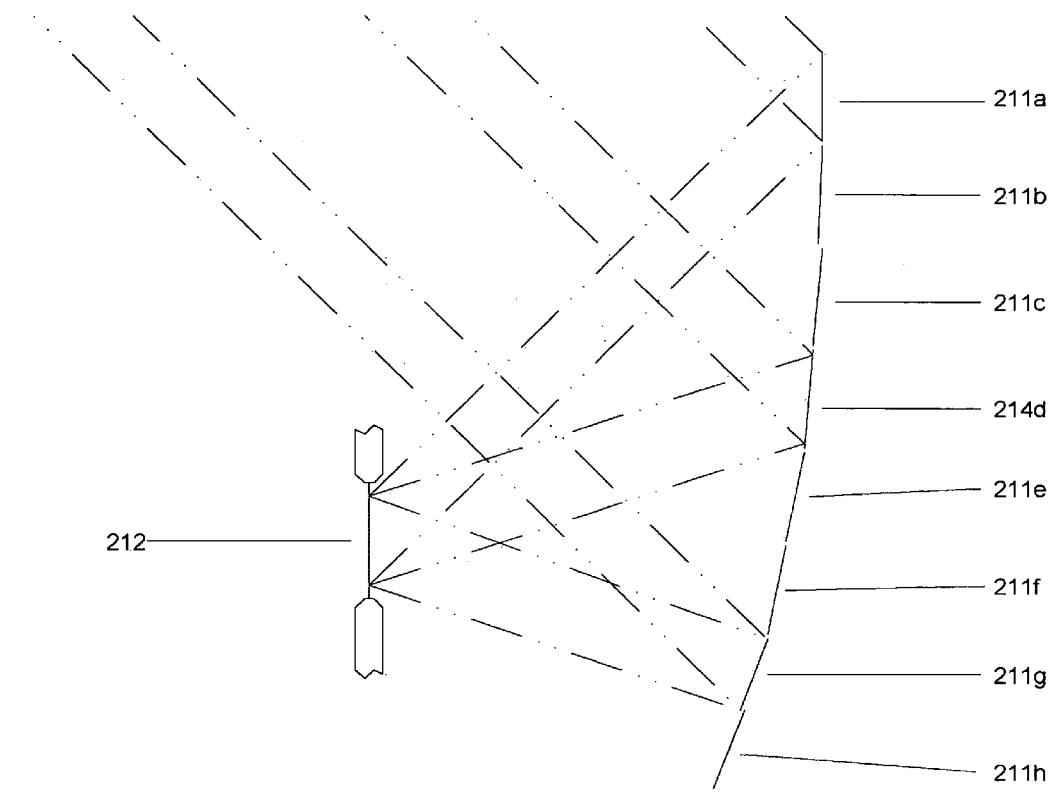
Figure 21: A use of multiple flat reflectors

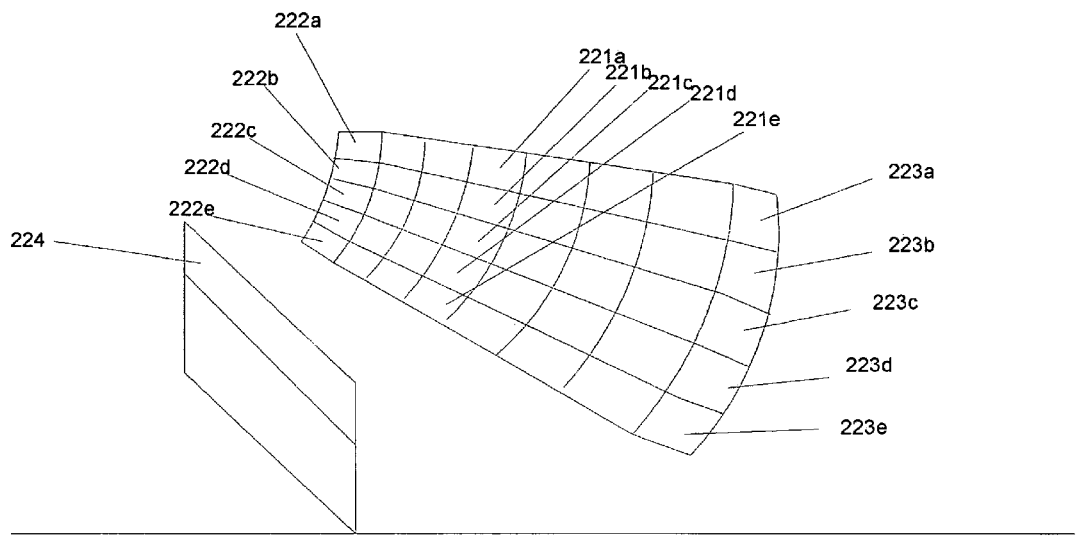
Figure 22: A reflector with tilted ends in perspective

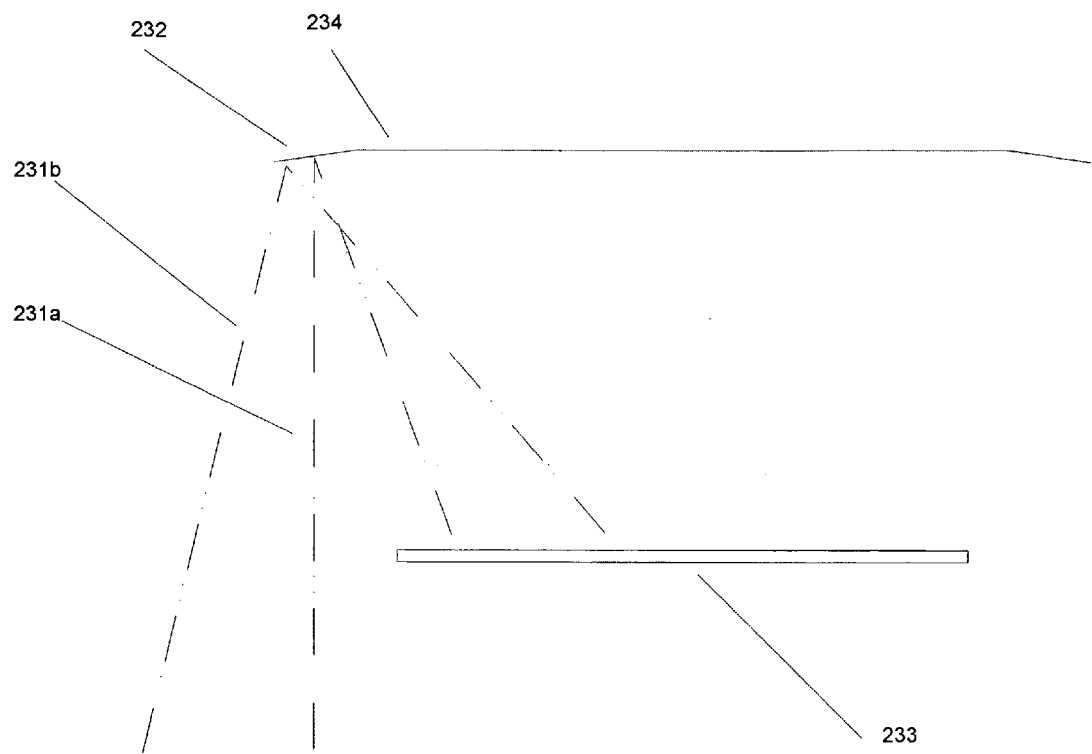
Figure 23: A reflector with tilted ends

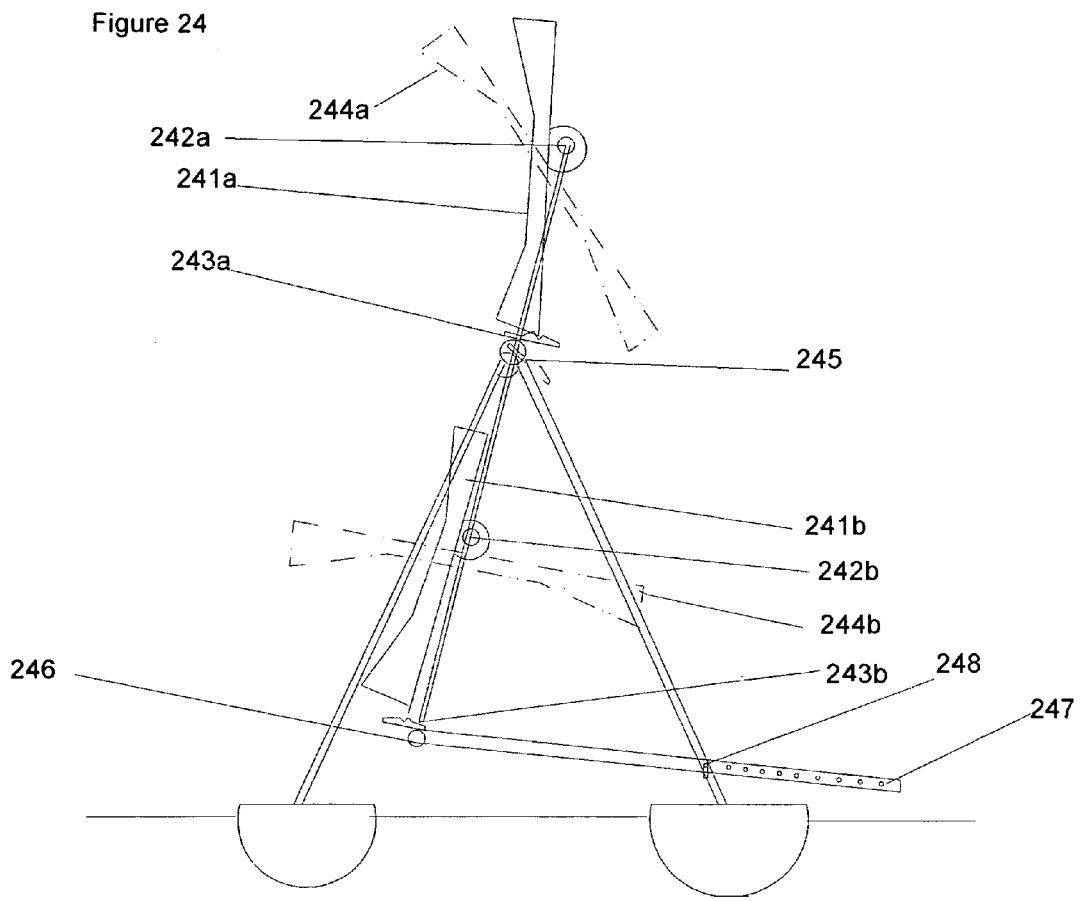
Figure 24: A reflector structure with multiple pivot points

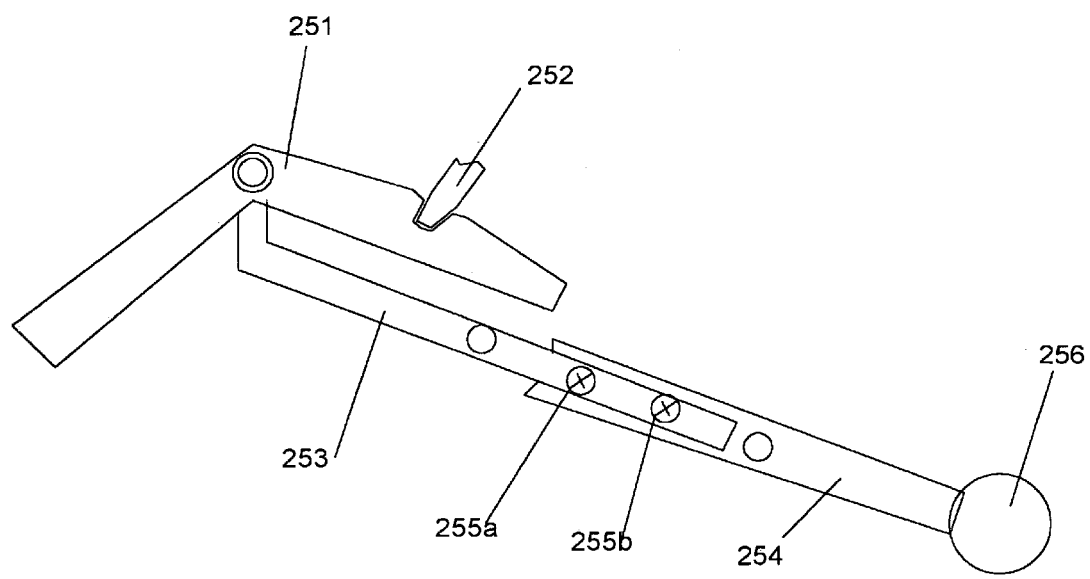
Figure 25: An adjustable latch mechanism

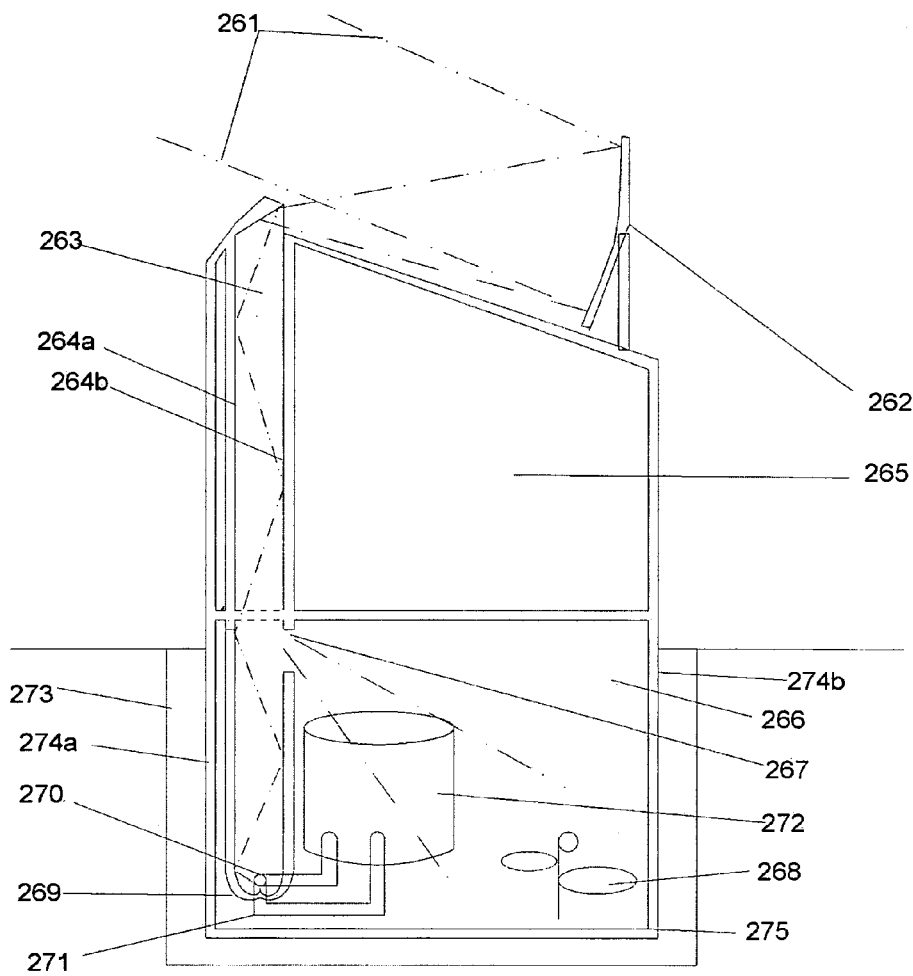
Figure 26: A house with solar hot water and a basement greenhouse

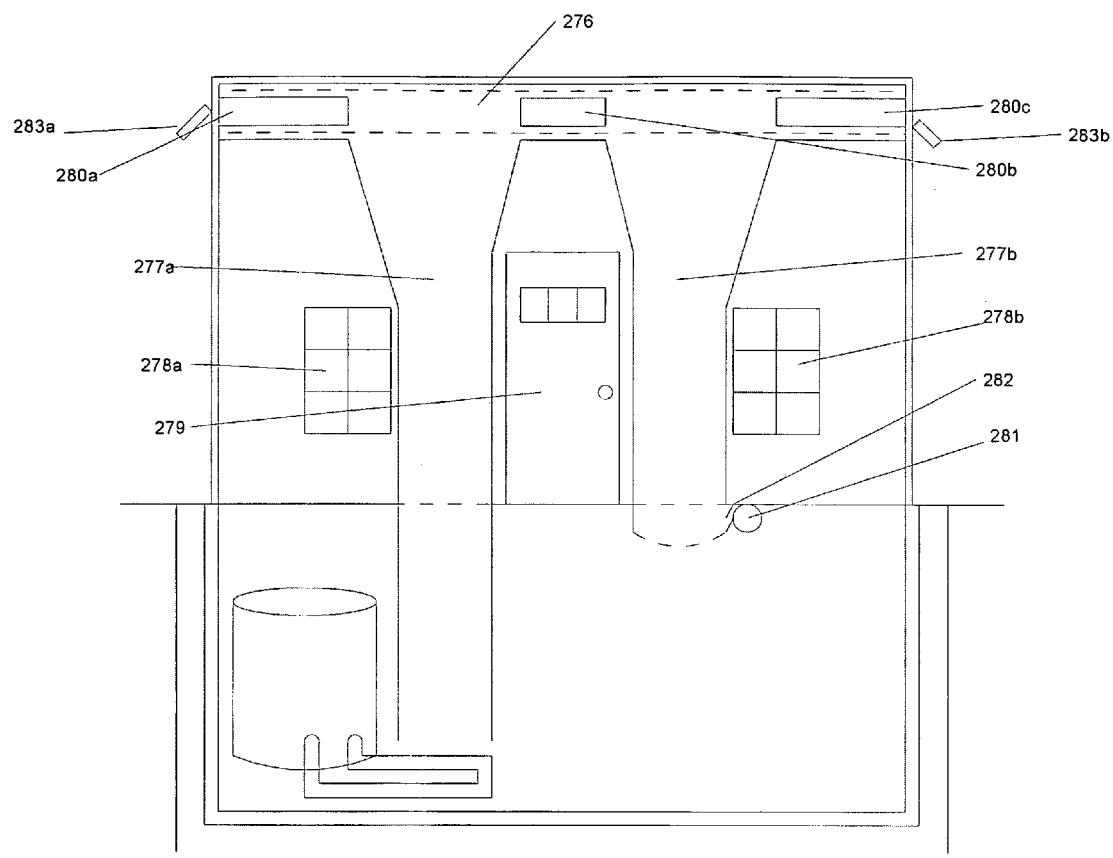
Figure 27: A front view of a house with solar hot water and a basement greenhouse

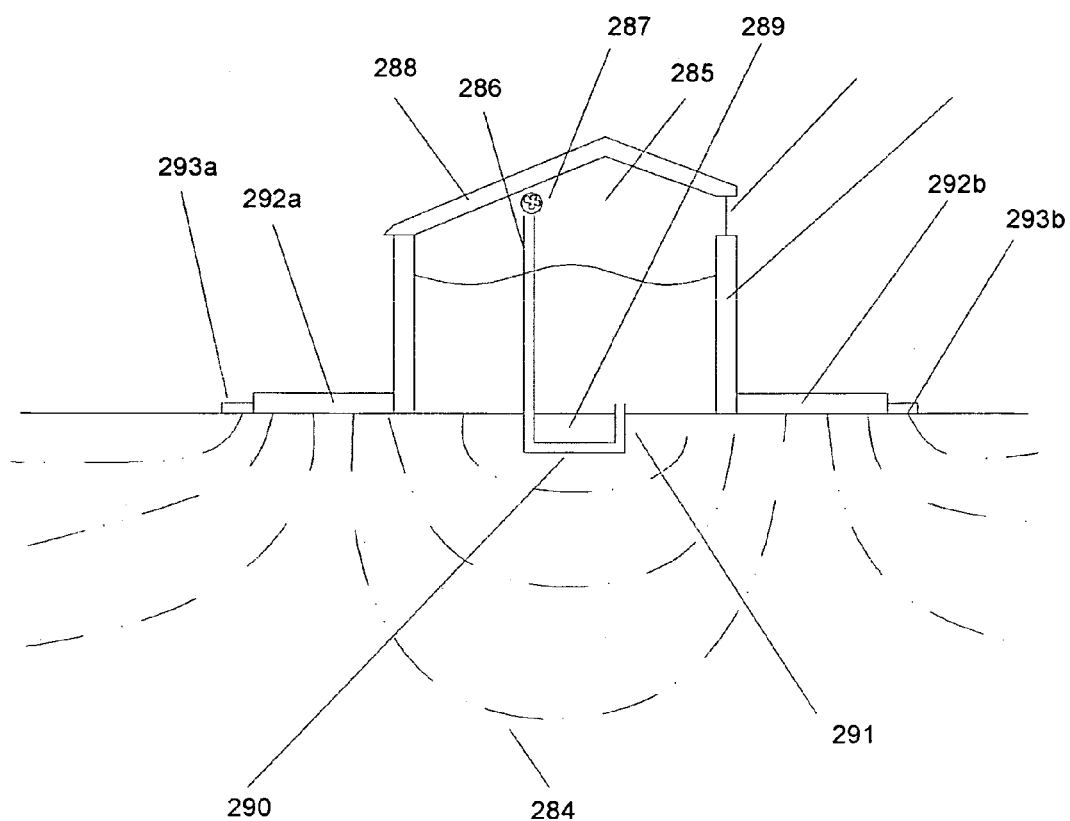
Figure 28: A greenhouse with a geothermal heat bank

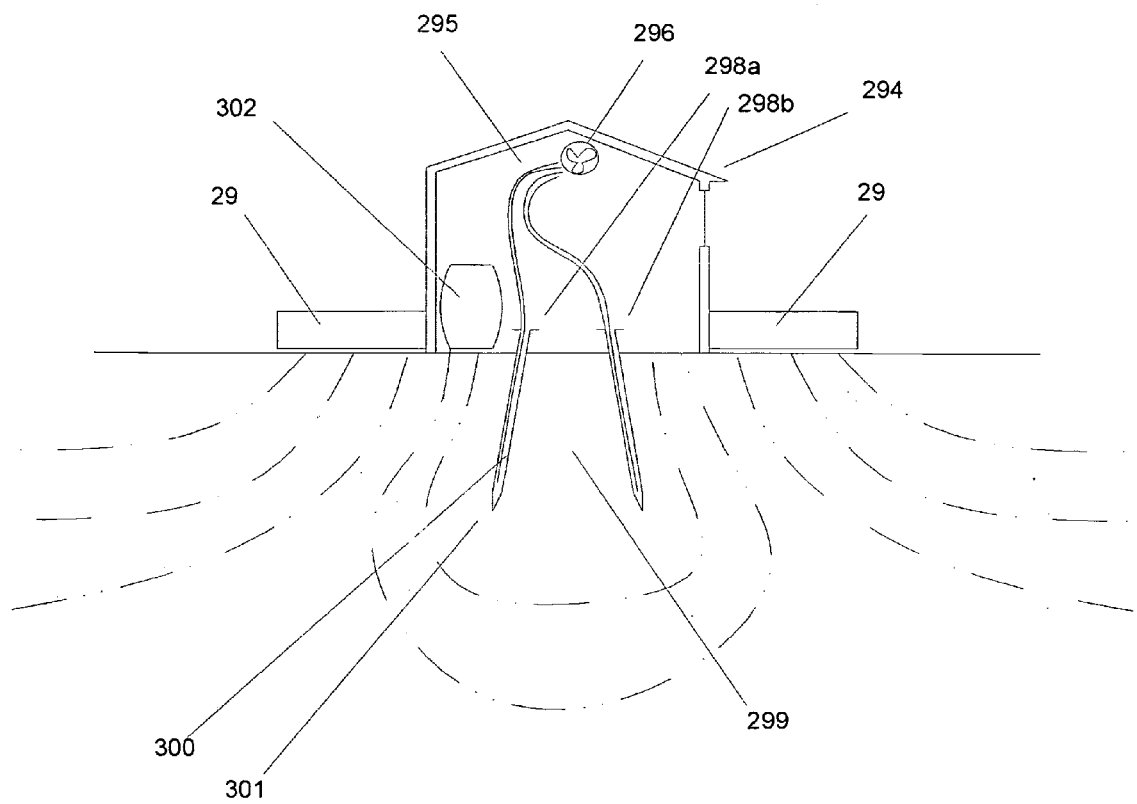
Figure 29: A greenhouse with an extended geothermal heat bank

SOLAR REFLECTOR, COLLECTING WINDOW AND HEAT STORAGE

CLAIM OF PRIORITY

This application for patent claims priority from provisional patent application 60/944,902 filed by the inventor's agent on Jun. 19, 2007.

REFERENCES CITED

U.S. Patents

| Pat. No. | Title | Issue date |
|---|---|---|
| 4,198,953 | Solar illuminated energy conserving greenhouse | Apr. 22, 1980 |
| 4,257,400 | Combined roof and solar heat structure | Mar. 24, 1981 |
| 4,111,360 | Solar energy concentrating and collecting arrangement and method | Sep. 5, 1978 |

FIELD OF THE INVENTION

This invention relates generally to Solar Heat Collectors, and, more particularly, to reflecting and concentrating sunlight and storing heat.

BACKGROUND OF THE INVENTION

Greenhouses are notorious wasters of heat in cold climates, which is expensive to the point where most winter produce is trucked in from tropical regions. Most greenhouses suffer the fundamental problem that if light can come into a window in the daytime, infrared heat can go out the same window at night and during cloudy weeks in winter.

Standard glass greenhouses often have a single layer of glass over the north and south roof of the greenhouse. This design often leaks heat through the glass, both convective heat and radiated heat. Single pane glass has an insulating value of perhaps R-1, where insulated walls might have an insulating value of R-20 or R-30. Also, many glass windows leak air around their edges.

A number of methods have been used to reduce heat losses in greenhouses. Low-emissivity glass blocks the outward and inward passage of infrared rays through the glass. Double or triple glazing, or some combination of glass and plastic windows, reduces convection losses. A double glazed window can have an insulating value of R-2.5.

Hoop houses have two layers of impermeable vinyl chloride kept apart by inflation with an air pump. While having two layers of plastic reduces heat losses and eliminates air leaks, heat losses at night and on cloudy days are still substantial. Also, the vinyl sheets decay after about four years and become toxic waste. Neither hoop houses nor classic greenhouses are particularly immune from the ravages of heavy snow, large hail and hurricanes. Kalwall, a fiberglass-plastic composite, lasts about 10 years before it becomes waste.

One window maker has constructed double pane window walls where the space between the panes can be filled with Styrofoam pellets at night. This device does reduce heat losses at night, but requires equipment to blow the Styrofoam pellets in and out. The problem of gathering sparse sunlight on windy, mostly cloudy days with in-and-out sun and clouds remains unsolved.

One promising solution is to focus and concentrate light through a small window and then spread the light out on the inside. As shown in Item A, U.S. Pat. No. 4,198,953 uses a Fresnel lens to get light through a small aperture into a greenhouse. However, this particular device requires that the Fresnel lens track the sun hourly. Furthermore, the Fresnel lens is in a vulnerable wind position, the windows are placed facing the sky so that the window might leak or be covered with dry leaves or other flammable materials, and the lens might become snow-covered.

At least two inventors have designed reflective linear troughs with end reflectors on the roofs of houses to concentrate sunlight into a linear target window. As shown in Item B, in U.S. Pat. No. 4,257,400 a section of a parabolic trough has been built on a house roof. This design keeps its target window nearly vertical, somewhat preventing rain from seeping in. On tree-shaded lots, the design's basic idea of gathering light from the roof is an improvement from gathering light from the building's south side. However, this particular design has snow shoveling and ice collection problems or can be covered with leaves, and the reflector could still be somewhat shaded by taller trees and buildings to the south. Finally, the upward-facing mirrored surface is angled to be less efficient per square foot of reflector in winter when heat and light is most needed, and more efficient in summer.

Another parabolic trough designed into a house roof, as shown in Item C, is demonstrated in U.S. Pat. No. 4,111,360, which generates plenty of heat but has several possible problems. Snow and leaves can accumulate on the flat part of the mirrored roof. Tall trees to the south of the house can block the sun from reaching the lower part of the roof. The collector pipe is up in the air, creating insulation costs for the collector pipe. Any heat leaking through the collector pipe's insulation is lost. Direct sunlight can't be gotten into the house for lighting—only heat from the collector pipe's fluid can be actively pumped into the house. If the collector's pump should ever fail then the collector might overheat and be damaged. The collector shown requires the construction of an overbuilt house to avoid tearing apart the house's steep peak in sustained hurricane force winds. Near sunrise and sunset, the trough's focal point is far to the east or west of the collector pipe, possibly focusing on a neighbor's roof or on a nearby tree.

If a greenhouse can be built which protects warm weather crops through the winter, a house or a commercial building could equally be built on the same principles. Currently 10% of the world's fossil fuel annual supply is used to provide heat for buildings.

SUMMARY OF THE INVENTION

Solar space heating is a blend of gathering quantities of sunlight and heat, storing heat and losing as little heat as possible. A reflector and target window combination concentrates a great deal of sunlight into a building cheaply. Later heat loss is minimized by having relatively tiny target windows. Great amounts of heat are economically stored in the tons of ground several feet underneath the center of the greenhouse. This storage solution keeps the greenhouse's indoor temperature moderately steady over the long term.

Side issues are solved. Problems of intermittent and partially shaded sunlight are solved by concentration, while fire hazards are minimized. Snow and leaf buildup problems are minimized. Wind gust problems are minimized. The greenhouse is designed for sustainability and for nearly zero annual energy costs.

The same reflector and target window combination heats hot water and produces concentrated photovoltaic power, where heat is a useful auxiliary product.

BRIEF DESCRIPTION OF THE DRAWINGS

FIG. 1 shows a clerestory roof target window, reflector and greenhouse.
FIG. 2 shows a reflected point focusing on a target line.
FIG. 3 shows a scissors joint.
FIG. 4 shows a combined clerestory roof and north wall solar installation.
FIG. 5 shows a combined heating and solar daylighting application.
FIG. 6 shows a combined heating and solar daylighting application in profile.
FIG. 7 shows a top view of a photovoltaic application.
FIG. 8 shows Heat fins on a photovoltaic panel.
FIG. 9 shows a greenhouse with a trench.
FIG. 10 shows a greenhouse with a trench in profile.
FIG. 11 shows a reflector with an indeterminate pivot point.
FIG. 12 shows a latching mechanism in perspective.
FIG. 13 shows a latching mechanism.
FIG. 14 shows an interaction between a reflector and a latching mechanism.
FIG. 15 shows a section of reflectors with wind holes.
FIG. 16 shows a shingled reflector design.
FIG. 17 shows a reflector structure.
FIG. 18 shows a multiple reflector structure.
FIG. 19 shows a wooden reflector structure.
FIG. 20 shows a reflector structure which minimizes wind pressure.
FIG. 21 shows a use of multiple flat reflectors.
FIG. 22 shows a reflector with tilted ends in perspective.
FIG. 23 shows a reflector with tilted ends.
FIG. 24 shows a reflector structure with multiple pivot points.
FIG. 25 shows an adjustable latch mechanism.
FIG. 26 shows a house with solar hot water and a basement greenhouse.
FIG. 27 shows a front view of a house with solar hot water and a basement greenhouse.
FIG. 28 shows a greenhouse with a geothermal heat bank.
FIG. 29 shows a greenhouse with an extended geothermal heat bank.

DETAILED DESCRIPTION OF THE INVENTION

In the invention's primary embodiment,
Note that the approximate directions north, south, east and west will be used in this document to describe applications in the temperate zone of the northern hemisphere. In the northern hemisphere the winter solstice occurs on or near December 21 of each year. Such directions would be reversed in the temperate zone of the southern hemisphere. In nearly equatorial sites such as, say, for example, at high altitudes, the south and north directions may be either reversed or maintained as is. At or near the earth's poles the direction of "north" may be nearly arbitrary for siting purposes.

In the embodiment shown in FIG. 1, a reflective linear trough (1) on a building roof, such as a greenhouse roof (2), concentrates sunlight (3) from any spot on the sun's daily arc from east through south to west, through a horizontally long target window (4), which may be, but doesn't have to be, a long series of smaller target windows in a line, in a clerestory roof of the building. Behind the target window and inside the building, the concentrated sunlight bounces against a flexible curved mirror (5) and spreads out. Light may be, but does not have to be, re-reflected in new directions behind the target window.

The building may have, but does not have to have, solid walls (6) where a traditional greenhouse usually has south-facing windows, windows on its roof, or windows in all directions. The embodiment shown has at least 90% less glass than the average all-glass greenhouse. Because even the most expensive glass or plastic leaks far more radiant heat per square foot than a heavily insulated wall leaks, a greenhouse design with 90% less glass retains heat at night or on cloudy days perhaps 80% better than an all-glass greenhouse. Load-bearing insulated walls tend to cost less to build per square foot than glass walls with load-bearing supports.

Winter sunlight in cloudy or high-latitude areas can be notoriously weak, leading to spindly plants which topple over or which don't bear much fruit. In this embodiment, the pre-concentrated sunlight might be applied to plants at, say, for example, 150% of December 21st sunlight, leading to stronger plants in early winter than a normal greenhouse can provide.

A nearly vertical reflector panel reflecting diagonally approaching sunlight in a roughly horizontal direction will at noon reflect its maximum square footage of reflected sunlight on the day of the winter solstice, because it most nearly faces the sun's path on the winter solstice, and the reflector's angled surface will reflect slightly less reflected sunlight at noon on the day of the summer solstice. This nearly direct reflection is an efficient use of cost-limited reflector area in winter, when sunlight is most needed for heat and light. The pivoting reflector will not be pointing as directly at the sun on June 21st in the northern hemisphere, and so the design slightly reduces the reflected amount of scorching summer sun on June 21st.

One embodiment of the target window is in a clerestory roof, where the target window stretches east and west in the middle of the roof. A clerestory window has the advantage of making the target window quite invisible from the street in a southerly direction. The clerestory window is shielded from view by a reflective trough in the northerly direction. Damage to the window from flying objects either propelled by high winds or thrown by vandals would be limited in the east and west directions. Having no windows at a building's normal window level makes a smash-and-grab burglary in an urban environment difficult, and the relatively narrow line of target windows can always be made burglar-resistant.

In this embodiment the reflective linear trough is also mounted on the roof, away from kids, with its reflective side facing away from kids on the ground on the north side who could damage the reflectors. Neighbors on the ground are protected against most of the glare reflected off of the reflectors and from all glare coming off of the target window. In normal use, a relatively small amount of glare can possibly be reflected to the ground from the two top corners of the reflector, either early in the morning or late in the day. If this reflected sunlight disturbs the neighbors, some type of screen might be installed to block this light.

Because this design uses a vertically oriented target window similar to common house windows, the building's overhanging clerestory roof protects the target window's glass from heavy snow buildup, from ice buildup, from rain leakage except in cases of strongly blowing rain, from large hailstones, and from southerly hurricane winds, which would typically be the most dangerous hurricane wind direction for east coast buildings. Rain runs off of a clerestory roof naturally. Snow buildup on a normal non-glass roof can create a natural insulation advantage over no snow on the roof, keeping heat from leaking out of the building's roof. Because the building doesn't rely on plastic sheeting, it can be built as a permanent structure, conserving resources. Its costs can be amortized over many years. Such a building can be built to local building codes. People who prefer not to pay for fossil fuels might live in a building with this embodiment.

The building's floor shown in FIG. 1 has a drain (7) in the middle of a concrete slab floor (8) which carries away water from normal greenhouse watering sessions. The concrete floor acts as a heat sink in said building, holding the heat of a sunny day for use at night. A solar building may, but does not have to, have a concrete floor or a drain.

As shown in FIG. 1, a portion of the light that has come through the target window is reflected with flexible curved reflecting mirror, which might run, but doesn't have to run, the length of the target window, down below the target window and then northward, to provide sunlight to the building's north side. The curved mirror has a greater curve near the window and less curve farther from the window. Having been redirected roughly 120 degrees around the lower clerestory ceiling structure, the sunlight spreads somewhat on its trip from the curved mirror to the building's floor or to other targets. Alternatives to reflecting mirrors may be used in some embodiments.

The rest of the sunlight passes above said mirror, with some reflecting off of a ceiling (10a-b) toward the building's south side. In this embodiment, the reflecting mirrors are pointed so as to reflect very little sunlight straight down upon the building's central walkway (11), sending the light instead to a number of plant tables (12a-b) on either side of the central walkway. A slightly curved bottom end on the curved reflector deflects most sunlight away from the walkway. This design increases the amount of limited sunlight that the plants get, and decreases the amount of harmful ultraviolet rays landing on workers in the central walkway. Sections of the curved mirror may be connected to the rafters which hold up the clerestory roof. The building may, but does not have to, use interior mirrors to deflect or reconcentrate sunlight in a useful direction.

The clerestory design has the specific advantage of using sunlight gathered far above the north edge of the building's roof, sunlight that would normally land on the yard well to the north of the building in winter, because the reflectors are mounted on the north edge of the roof. In the winter, this over-roof sunlight typically is less shaded by a nearby tree (14) and nearby buildings than sunlight falling on the building's roof or falling on the building's south side. Trees typically don't occupy the airspace over a building because trees don't grow on building roofs, so the sunlight slanting down above a building typically is less blocked by tall trees, by nearby buildings or by similar reflectors in an array of reflectors. In practice, many buildings in cool climates are built on tree-shaded or on urban sites. The ability to use the best sunlight typically maximizes any building's light absorption per square foot of reflector. The reflector, being sited above said building's north wall, is directly supported by the building's north wall, simplifying construction.

The top edge of the clerestory roof (15) is beveled at an angle to make a sharp vee pointing north with the bottom edge (16) of the roof. The sharply angled bottom edge provides a smooth reflective surface to guide the greater part of slightly strayed reflected sunlight from any slight reflector misalignments into said target window. The angled top edge lets sunlight pass to the reflector on or near December 21st, and allows a portion of stray reflected sunlight to pass by back into the sky.

As shown in FIG. 2, any particular point (21) on the reflective side of a properly aligned linear trough focuses on one point or another (22a-c) on a linear target (23) all day, because a linear trough is aligned with the sun's path through the sky on that day. Reflective end pieces (24a-b) on the linear trough reflect early morning and late afternoon sunlight back to the target window. In practice, reflections before 8:00 a.m. or after 4:00 p.m. standard time will strike the target window at a sharp angle, and for standard window glass, little sunlight will penetrate the window at a sharp angle.

As shown in FIG. 3, a clerestory roof may be supported by, but does not have to be supported by, rafters forming scissors trusses (31a-c). The trusses may be held together with metal connectors (32a-c), and may be, but don't have to be, covered with either mirrored or reflective material or paint to increase the light reaching the floor of the building below. In this embodiment a target window (33) may swing up on a hinge (34) to vent hot air out of the top of the building. Openable windows may, but don't have to, have latches that can be unlatched and opened with a pole from the building's inside.

In this embodiment thick insulation (35a-b) is applied on the bottoms of the roof sections except just behind the target window (36a) and between the rafters just underneath the target window (36b). These areas are important for light reflection and so thin, fire resistant insulation is used here. Sections of reflecting mirrors may be, but don't have to be, placed between adjoining rafters. A slippery and fireproof roof surface (37), such as, say, for example, aluminum sheeting, is installed on the top of said roof below the target window.

The slippery roof surface ensures that flammable leaves or debris blown on the roof will slide away from where sunlight is concentrated at the first sign of a breeze. A fireproof roof ensures that the concentrated sun, when misdirected onto the roof's surface or onto dry branches on the roof's surface, doesn't set the roof on fire. Also, humans and animals such as cats are made uncomfortable by a slippery roof so that they don't sleep near the target window and possibly suffer eye or skin damage from concentrated sunlight.

In one embodiment, the indoor edges of the various rafter beams facing the target window are formed into vee shapes and covered with reflective material, to reflect incoming sunlight off at a gentle angle instead of directly back out the window. This shaping allows the reflective surfaces to reflect more sunlight to the floor of the building.

In one embodiment, to avoid having the building's owner or maintenance worker climb on the roof to adjust the reflectors weekly, each reflector unit is connected to a set of gears which repositions the reflectors, so that a worker on the ground can safely adjust the array. The reflectors may, but do not have to, be adjusted by a crank mechanism similar to mechanisms used to deploy store awnings.

The embodiment shown in FIG. 4 combines a rooftop reflector (41) and clerestory window (42) with a ground-based reflector (43) and a window (44) on a wall away from the sun's path (45). On the winter solstice the ground-based reflector catches the light that barely clears the roof reflector.

The embodiment shown in FIG. 5 uses a plurality of reflectors (51a-c). In this embodiment, on the winter solstice each reflector catches the light that barely clears the reflector in front of it. This means that roughly 100% of the December 21st sunlight (52) falling on the building's roof can be redirected by multiple reflector rows into the building or buildings and onto greenhouse plants. The embodiment maximizes efficiency from a limited sunlight source. While the embodiment shown in FIG. 7 is on a building's roof, the arrangement of a plurality of parallel upward-reaching reflectors does not have to be on any particular building or other structure.

As shown in FIG. 5, two clerestory windows are installed in various positions on the roof. In practice, target windows (53*a-b*) might be installed anywhere on the roof, or on a wall below the roof.

Elsewhere in FIG. 5, a target window (54) has been installed above the south wall of a flat roof (55). Buildings may use flat roof target windows, but are not limited to using them.

In the embodiment shown in FIG. 6, heat generated behind a target window is pumped through a set of vent pipes (61) to a heat storage area (62) within a building. Return air is pumped up another set of vent pipes (63) to the target window.

In the embodiment shown in FIG. 7, a target window on a flat roof absorbs sunlight (71) reflected off of a linear trough (72) and for some parts of the sunlight, off of flat side reflectors (73*a-b*) on the linear trough. A double glazed target window (74*a-b*) on the south side of an existing flat roof faces north and slightly upwards, toward the center of the linear reflector trough. Concentrated sunlight shining onto and through the almost vertical target window lands on an array of unencapsulated photovoltaic panels (75) behind the windows. Air is moved with a fan (76) from a vent which has been cut in the flat roof (77), up the window side of the photovoltaic panels (78), around the far end, down the enclosed side behind the photovoltaic panels (79), and down through another vent hole in the roof (80). In summer, air is moved into the enclosed space from a vent leading outside (81) and out another vent leading outside (82).

A waterproof enclosure such as a target window filled with heated air is a substitute for encapsulation of the photovoltaic panels, as it keeps them dry and in low humidity. This allows the use of the cheaper unencapsulated version of photovoltaic cells, and allows heat to be better transported off of the photovoltaic cells, which extends their operating life. Cooling is particularly important when using concentrated sunlight on photovoltaic panels. Photovoltaic cells within or anywhere behind a target window may be, but don't have to be, unencapsulated.

This particular airflow design puts the cooler air in front of the photovoltaic panels and the warmer return air in back of the panels. In this way the panels act as another layer of insulation for the warmer return air, increasing the air's heat gain in the winter. An up-and-back airflow design may be used, but does not have to be used.

In one embodiment translucent photovoltaic cells are used. Certain wavelengths of concentrated sunlight are transformed into electric power, while other wavelengths pass through the translucent photovoltaic cells and do not heat the cells.

In the embodiment shown in FIG. 8, heat fins (83*a-b*) are attached to the back of an unencapsulated photovoltaic panel (84). The heat fins run in a horizontal direction across the surface of a photovoltaic panel to reduce air friction, as the airflow across the cells is horizontal.

In one embodiment, a collector pipe for heating hot water, and a secondary reflector, is placed behind a target window. Because the collector pipe is indoors, actual water can be run through said collector pipe, as opposed to, say, for example, an outdoor water heating panel where a propylene glycol mixture is used in said collector pipe. Concentrating sunlight also leads to higher water temperatures.

In an embodiment shown in FIG. 9, a target window (91) is placed on a building's wall (92) and not on the roof (93). This target window placement has the advantage of simple roof design and easily reachable windows, which reduces construction cost and reduces window opening and window washing problems. This target window placement is also high enough to be out of reach of small children. If for some reason the reflector's focus is not maintained in the winter or spring, the target window is sufficiently above from the ground that the sun's focused reflection will take months to creep from the window down the wall to the ground. In this particular embodiment the reflectors are not connected to the building's roof.

In the embodiment shown in FIG. 9, the building has a natural dirt floor (94) that allows plants (95) to grow deep roots. The building has a trench (96) with pavers (97) in the bottom of the trench, so that a gardener (98) might work on nearby plants at waist level in the greenhouse and so that adequate headroom for people is provided but the walls need not be built as high. A trench also provides more of an interface between the building's air and the dirt below. This helps reduce temperature fluctuations inside the building.

In the embodiment shown in FIG. 10, the building's south and east walls (101*a-b*) have no windows and can be easily constructed. They can be made of, but are not limited to, a type of cinder block constructed from 80% wood and 20% concrete. They can also be made of, but are not limited to, straw bales coated with a plaster or concrete coating. The building has steps (102) down to a door (103). The building has a linear reflector trough comprising, say, for example, 8 reflectors (104*a-h*) and two end reflectors (105*a-b*) to eliminate sideways glare and to increase solar gain in the early morning and in the late afternoon.

Any number of windows, vents and greenhouse venting fans may be added, but don't have to be added, to the building, with the understanding that the extra windows may lose extra heat at night, reducing the building's heat efficiency.

In one embodiment a linear trough reflector can pivot out of the way of the wind's direction to a mostly horizontal position, either swinging north or south, when a strong gust of wind hits said reflector. The new position spills the wind gust, reducing the maximum expected stress on the reflector's support structure. Horizontal pivot points for focusing a reflector may, but don't have to, double as wind gust pivot points so that the reflector may be blown edge-on to the wind in an extreme wind gust.

In one embodiment the reflector's pivot point is located significantly above the halfway mark of the reflector's sail area, so that the wind pressure on the majority of the reflector's sail area overwhelms the wind pressure on the smaller amount of the reflector's sail area.

Having a pivot point above a reflector's center of gravity allows the reflector to swing back to its normal position after the gust passes. Having the pivot point moderately close to the reflector's center of sail area reduces any violent whiplash imparted to the reflector's lower end by a high wind gust. The wind pressure on the larger sail area portion of the reflector still overwhelms the sail pressure on the reflector's smaller sail area portion, but the reflector won't pivot around quite as fast. A reduction in pivoting velocity can consequently reduce the rare chance of damage or injuries to any person, animal or object standing behind or in front of a reflector when it releases in a wind gust. Also, a pivot point nearer the reflector's center can reduce the minimum distance behind the reflector needed for free swinging, and a pivot point nearer the center lowers the force a maintenance worker needs to apply to the reflector to make periodic focusing adjustments. In the end, an optimal pivot point is a rough tradeoff between prompt pivoting response in a wind gust and minimizing the reflector's swinging-out distance.

Another embodiment of a reflector is shown in FIG. 11. A support point and an indeterminate pivot point is created by one or more straps of strong material such as strapping tape (111) in front of a reflector (112), where the straps and reflector encompass a horizontal support beam, such as a pipe (113). The horizontal support beam is supported on each end by vertical support beams, such as pipes (114) that are set into the ground.

Such a reflector may, but does not have to, be made of bowed plywood with one or more wooden planks (115) with a bow shape (116) cut into the planks, backing the plywood for stiffness. A Mylar reflective surface (117) is attached to the concave side of the plywood. In this embodiment objects such as, say, for example, bricks (118a-b), each of a certain weight, are placed against either side of the bottom of the reflector (119).

The reflector's bottom and the bricks can be repositioned to refocus the reflector. The bricks also act as a primitive latching device which will slide away or otherwise release under enough wind pressure. In a strong wind gust, either a northerly or a southerly gust, the wind pressure on the reflector will slide at least one of the two bricks backwards (120) and out of the way, releasing the bottom of the reflector to swing out (121) in the direction of the wind gust. As the bottom swings out and the reflector blows to a more horizontal position, the top end of the reflector and strap will then slide down around the horizontal support pipe until roughly the top end of the strap and reflector is tightly around the support pipe. The reflector would then be supported in a more horizontal position by the support pipe on top and by the ground on its bottom.

In this more horizontal position the reflector would still be able to flap up and down if gusts persist from the original wind direction. The now diagonal reflector would also present less of a sail surface for successive wind gusts in the opposite direction. The strap keeps the reflector from blowing away in the wind and causing damage to a neighbor's property.

This inexpensive reflector will not automatically return to its previous focus, but will usually end up either reflecting into the ground or the sky at a somewhat more horizontal angle than before. Stopping at a diagonal or closer to horizontal position will keep the reflector from randomly focusing on any potentially flammable target when the sun returns until the reflector has been refocused.

An embodiment of a reflector release mechanism, as shown in FIG. 12, uses a gravity-operated metal latch hole with non-parallel sides. In this embodiment the mechanism features slippery angled latch bolt sides (122a-b) and slippery angled latch hole sides (123a-b). A large amount of lateral pressure applied to a latch bolt (124) can overcome a smaller amount of counterweight from the mechanism's counterweight arm (125) which, balanced around a pivot (126), normally keeps the latch bolt in place. Under sufficient lateral pressure, the angled surface of the latch bolt will slide along the angled surface of the latch hole, depressing the latch hole until the latch bolt pops free of the latch hole.

The embodiment shown in FIG. 13 has two prongs (131a-b) on a range limiting mechanism's bottom connected firmly to a pivot pipe on which a latch pivots up and down. The prongs have flexible tips (132a-b) which bump against the moving latch mechanism (133) and limit the top and bottom of the latch mechanism's range of motion. Flexible and soft prong tips will reduce bouncing noises. The latch mechanism may use, but is not limited to, the prongs and counterweight arms shown in FIG. 13.

Whenever a reflector swings back and re-latches by itself, it saves an attendant from manually rectifying a blown out reflector. Properly functioning, automatically rectifying sections of reflector also reduce any fire and glare dangers to outside property, as they keep light focused into the building on extremely gusty days.

As shown in FIG. 13, the latch mechanism has two long ramps (134a-b) upon which one of the bottom surfaces of the latch bolt's tip (135a-b) will touch squarely and slide across, easily depressing the latch mechanism as the latch bolt nears the latch hole. Near the latch hole, the surfaces of the latch mechanism are slightly slanted inward toward the latch hole (136a-b) so that if the latch bolt should leap over the latch hole, one of the latch bolt's slanted bottom edges will land squarely on the slanted far side of the latch mechanism, continuing its slide over and past said latch hole. The steep edges of the latch bolt (137a-b) may be coated with a slippery substance, such as, say, for example, oil, or plastic, for long-lived sliding ability. In this embodiment the inner contour of the latch hole (138a-d) fits snugly against the contour of the latch bolt when inserted.

The set of matching slanted edges on the latch bolt and latching mechanism are designed to reduce wear and tear on the bottom edge of the latch bolt and latch mechanism from repeated violent clashes of the latch bolt and latch mechanism. The snug fit of the steep sides of the latch bolt and latch hole will reduce rattle in normal use.

When the latching mechanism is pushed down by an approaching latch bolt, and when the counterweight arm is consequently pushed up with rotational momentum, the latch mechanism needs a fraction of a second for gravity to counteract the latching mechanism's momentum and to latch back into place on the bolt. In the embodiment shown in FIG. 14, the latch bolt at the end of a reflector panel (141) swinging quickly or violently into the latch mechanism (142) from either side would strike a long ramp, would push the latch mechanism down with force, and then would jump over the latch hole. A released reflector may violently pivot when propelled by wind gusts, by the stored-up force of gravity or by inertia, or by any unexpected force after being initially dislodged from its focused position. A reflector should only re-latch into its focused position when swinging gently into its latch mechanism.

The process of allowing the reflector to swing freely past the latch at great velocities, while allowing the reflector to latch back into place at low velocities, allows the structure of the reflector, latch mechanism, and any supporting framework to be more inexpensively engineered.

In the embodiment shown in FIG. 15, reflectors (151a-c) are mounted on a substrate which could be made of, say, for example, plywood. The substrate has end sections (152a-b) which somewhat protect the reflectors from collisions with objects from the left or right. In this embodiment the reflectors overhang the substrate on the bottom edge (153a-c). Wind pressure release holes (154a-f) are drilled through the substrate in gaps (155a-b) between adjacent reflectors. Many small, distributed wind pressure release holes are somewhat effective in reducing the force of a hurricane gust on a reflector panel. The substrate also has screw holes (155a-h) for quick attachment in the field of prefabricated sections of reflectors to a framework. The bonding of glass or metal to plywood is a job best done indoors, and the shipment of delicate glass or metal reflectors is best done in easily handled sections.

In the embodiment shown in FIG. 16, reflector sections (161a-d) have been screwed together in a shingled pattern, where each reflector (162a-d) covers over the top of the next reflector below it. A small, long roof (163) covers the top reflector section. Reflector sections are screwed through spacers (164a-c) where necessary to the reflector's frame members (165*a-d*). This arrangement sheds water well, as it emulates traditional shingling of walls. It also quickly sheds ice as it melts loose from reflector surfaces.

In the embodiment shown in FIG. 17, two beams, such as, for example, angle irons (171*a-b*) backing the reflector surfaces (172*a-h*) are cross-braced with braces (173*a-b*). The angle irons are attached to a horizontal support beam, such as a pipe (174) with pivots, such as pillow blocks (175*a-b*). The horizontal support pipe is supported by a vertical support beam, such as a pipe (176) the bottom of which may be buried into the ground (177). The bottom latch ends of the angle irons (178*a-b*) fit into latching mechanisms (179*a-b*). They pivot to a limited degree on the latching mechanism's support beam, which might be, for example, a pipe (180). The latch is kept a proper distance from the latching mechanism and the horizontal support pipe by a vertical beam, such as a pipe (181) connected to a pivot connected to or pivoting in parallel with the support pipe, such as a pillow block (182).

The moving part of each latch mechanism pivots around the focusing pipe within specific limits, allowing the bottom of each reflector's frame to latch into the mechanism and release under pressure.

In case of the entire reflector section's 360 degree upside down violent swing, the top of the reflector will clear the latching mechanism. Only the latch end will meet the latching mechanism.

In this embodiment the vertical focusing pipe is connected to the vertical support pipe by a strut (183) with several holes in it, and a bolt (184).

The bolt can be removed and reinserted through any hole in the strut and then into a hole in the vertical support pipe. By moving the bolt from hole to hole, the reflection angle of the reflector can be adjusted.

Because the focusing pipes pivot on pillow blocks around the same axis as the reflectors, the latch holes in all latching mechanisms are always is the same distance from the support pipe, and the same is true of the latch ends of the reflectors, and so the latch ends of the reflectors can always lock properly into the latching mechanisms.

The top and bottom reflector faces have rounded outer corners (185*a-d*). In the event of a wild swing caused by a wind gust, these high-velocity corners are the parts of the reflectors that could cause the most cutting damage to a human standing behind or in front of the reflector. Rounding the corner reduces the potential for damage.

In the embodiment shown in FIG. 18, a parallel row of multiple reflector units (187*a-d*) can pivot on a single horizontal support pipe (188), which is supported by multiple vertical support pipes (189*a-c*) and which supports multiple horizontal focusing pipes (190*a-b*). In this particular embodiment, two reflectors are connected to each set of focusing pipes. Room has been provided between reflectors for the pipes, so that free-swinging reflectors won't hit the pipes.

In the embodiment shown in FIG. 19, two structural beams, such as, for example, 2×8 planks (191*a-b*) back the reflector surfaces (192*a-h*). Each structural beam is sawed out to create a parabolic curve, and each plank is attached to a pivoting joint, such as, for example, a pipe section (193*a-b*). Each pivoting joint is supported in this embodiment on each side by vertical support planks (194*a-d*), the bottoms of which may be buried into the ground (195) for support. In another embodiment the planks may be attached to a wide framework which sits on the ground. The bottom latch ends of the structural beams (196*a-b*) connect to latching mechanisms (197*a-b*), which are connected to a moveable bar (198).

In the embodiment shown in FIG. 20, flat individual reflector panels (201*a-h*) are not lined up vertically as a single face, but are staggered so that the top of one reflector panel doesn't touch the next panel. This configuration allows moderate wind gusts to pass between reflector panels, spilling air, and reducing pressures caused by wind gusts. This embodiment's reflector panels are arranged from top to bottom with the bottom edge of the higher panel always closer to the target than the top edge of the next lower panel, so that, when the reflector is focused on the day of the winter solstice, no direct sunlight gets between the reflector panels at any time of the day. With higher reflector panel bottom edges always closer to the target than top edges of the next lower panel, if the reflector array reflects 100% of the sunlight falling on it from 7:00 a.m. to 5:00 p.m. when in focus on the day of the winter solstice. The reflector will also reflect 100% of the sunlight when in focus on any other day of the year. This arrangement also creates a shingling effect for shedding water and ice from said reflector.

In one embodiment the reflector panels are 1 foot tall and 4 feet wide, and the bottom edge of each reflector surface ends an inch behind the top edge of the next reflector surface below. This design allows a bit of a horizontal breeze and ambient horizontal light to pass through easily.

In the embodiment shown in FIG. 21, a reflector trough comprises several flat reflector faces (211*a-h*) as opposed to a single curved parabolic face. Every flat face is aimed to reflect sunlight onto the target window (212). The sunlight reflections off of flat faces 211*a*, 211*d* and 211*g* are illustrated in this figure.

The purpose of using a limited number of flat faces is to avoid focusing too much sunlight on any one target point. By this method, even if several of said flat faces are misaligned, every point on the target's face is limited to a specific maximum amount of full sun, say, for example, eight times normal sunlight given eight rows of reflectors. This design reduces the chance of setting fire to dry branches or other combustibles in front of the target. The focusing of five times normal sunlight occurs in nature, but that level of concentrated sun tends to never spontaneously cause fires. Limiting sun concentration also limits eye and skin damage to humans and to small animals on a structure's roof, say, for example, housecats. In cases where said reflector is misfocused, limiting maximum sunshine prevents or limits heat damage to other portions of the structure or to objects, animals or people on or near the structure. Because a consistently limited amount of light penetrates the target window, this embodiment limits sun damage to objects inside, say, for example, greenhouse plants. The embodiment limits damage to photovoltaic cells at or behind the target window, which is important because photovoltaic cells are often heat-sensitive and suffer early degradation when consistently exposed to excessive heat.

The reflector embodiment shown in FIG. 22 has multiple flat rows of reflector faces (221*a-e*) and one or more reflectors on each end (222*a-e*, 223*a-e*) of the flat rows which are tipped inward a few degrees, say, for example, ten degrees. Given a limited number of square feet of total reflector area and given a relatively short linear trough reflector and target window, this embodiment slightly increases the amount of sunshine hitting the target window at times when the sun is high in the sky. On a partially shaded lot, such times may be the only times of day when any sunshine is available. However, this embodiment does increase the hazards of concentrating too much sun on any one spot.

In the embodiment shown in FIG. 23, sunlight (231) reflects against an end part of a reflector (232) which is tipped inward toward a target window (233) at a slight angle. In partly shaded locations, the end part is in typical use seeing maximum winter sunlight between 10:00 a.m. and 2:00 p.m.

By tipping the reflector's end part, more of the maximum winter sunlight is reflected into the target window. Ends tipped inward, in concert with a flat main section of a linear trough (234), gathers sunlight efficiently into the target window.

The reflector embodiment shown in FIG. 24 has multiple levels of reflector sections (241a-b), one above the other. Each section is attached to a pivot (242a-b), is latched at its bottom (243a-b), and each section can blow out as needed to a blowout position (244a-b). The action of pivoting the entire reflector to match seasonal sun angles is performed by a third pivot (245). The entire reflector can be rotated to alternative focus positions. In this embodiment the bottom of the entire reflector is connected by a rotating bolt (246) to a strut with many holes in it (247). A bolt (248) slides through one of the holes in the strut, and then through a hole in the support pipe to lock the two row reflector into a certain angle of reflection.

This embodiment needs less room in front and in back for the free swinging of blown out reflector panels than a one-row reflector, a useful trait on a rooftop where rows of reflectors and rows of clerestory windows are packed close together. The smaller reflector panels also blow out at a lower velocity and pack far less momentum because of their reduced size, reducing the potential injury done to any human or animal who might be in front of or in back of the panels. Reflector arrays may, but do not have to, pivot at one point for blowouts and at another point for tracking the sun. A reflector array may, but does not have to, be limited to two rows.

As shown in FIG. 25, the latch mechanism (251) holding the latch for a row of a reflector array (252) is attached to a bar with several holes (253), which can be attached in several positions to a second bar with several holes (254). Screws (255a-b) may lock the two bars together. The second bar is attached to a horizontal pipe for that row (256).

This plurality of latch positions allows each of the reflector rows shown in FIG. 24 to be seasonally focused by moving the latches, and the whole array as well can be focused. In practice, an upper level latch might be moved two or four times a year for seasonal fine tuning of the array's focus, while the entire array might be adjusted weekly. Such an embodiment would allow good year-round focus with minimal work and minimal reflector array cost. Multi-row reflectors may, but do not have to, have individually adjustable rows.

In the embodiment shown in FIG. 26, light (261) concentrated with a linear trough reflector (262) can be reflected down a cavity (263) with reflective walls (264a-b) inside a building (265), to the building's basement (266). In the basement, part of the light travels through an exit hole in the cavity, (267) to illuminate plants (268) in the basement. Another part of the light is reflected to a concentrating mirror (269) at the bottom of the cavity which reflects the light onto a solar collecting pipe (270) full of water. The collecting pipe is connected by pipes (271) to a hot water storage tank (272). The basement has insulation (273) on the outside of its concrete walls (274a-b) and floor (275).

In operation, during a sunny part of the day, the embodiment shown in FIG. 26 delivers concentrated sunlight down the reflective cavity to plants in the basement, allowing plants in winter to grow in a permanently frost-free environment. Waste heat created by said sunlight is absorbed by the insulated concrete walls and floor. This heat is released at night, and percolates up to the rest of the house, displacing the use of heating fuel. In this way the sunlight serves two purposes.

The portion of the sunlight that is focused on the hot water collecting pipe heats water in the collecting pipe. Heated water in the collecting pipe rises into the hot water storage tank after being heated by being displaced by cooler water. In contrast to most rooftop hot water generating systems, no circulating pump is needed. At night, the cold water in the heat collecting pipe doesn't rise, and so the heat stored in the hot water tank is preserved. This hot water generation system uses very little plumbing and, due to extremely short pipes, very little plumbing insulation compared to a rooftop system, saving money. Because of the extreme concentration of sunlight, the collector pipe may be tiny. Extreme concentration also allows water to get hotter in less time. No antifreeze is needed, as in this embodiment the entire hot water heating apparatus is safely in the basement and will never freeze. Nor is a basement hot water system susceptible to snow or hail damage. Any water leakage is in the basement, where leakage damage is minimized. As before, any waste heat generated in the basement becomes absorbed by the insulated concrete walls and floor for later winter heating needs.

The embodiment shown in FIG. 27 shows a building. Concentrated light is admitted to a building by a target window (276). Two mainly vertical light shafts (277a-b) lead to a basement. The light shafts allow room for the installation of windows (278a-b) and a door (279) on the first floor's wall. Some of the gathered light is used on photovoltaic panels (280a-c) just behind the target window near the building's roof. The light shafts reflect sunlight down into the basement, and also serve as air shafts. A fan (281) next to a translucent frosted surface (282) draws waste heat from the photovoltaic panels located in one of the shafts into the basement for active solar heat storage in the winter. In the summer during sunny periods, the fan blows waste heat out of the basement to a vent at roof level (283b), drawing fresh air in through another vent (283a). The air flow also takes waste heat created under the roof out the vent to the outside. At night, cool air is drawn in the roof vent through the fan to the basement, and air is returned up the other shaft.

In the embodiment shown in FIG. 28, hot daytime air (285) is driven through a pipe (286) by a fan (287) from the top of a structure (288) down into the ground below the center of said structure (289), through the ground in a horizontal section of the pipe (290), and back up a third section of pipe (291) into into structure again. The air's heat is transferred to the pipe, and then into the ground. Given hot air inside the structure and cold air outside, temperature gradients set up between the ground below the structure's center and the ground adjoining the outside air. These gradients are illustrated in FIG. 28 with isothermal lines in the ground.

The structure has an insulated skirt (292a-b) around its outside walls, and a smaller, less insulated version of the same insulated skirt (293a-b) at the outside edge of the first skirt. Where present, insulation keeps the ground from transferring heat directly to the outside air. The ground has an insulative capacity of roughly R-3 per foot of ground that heat must travel through. For stored heat to travel from the ground beneath the structure's center to the outside air, it must traverse through the ground, first from the center area to some wall, and then under the skirt. A total distance of, say, for example, eight feet would be roughly equivalent to R-24 insulation containing the heat in said ground underneath the structure's center.

Heat leaking downward will eventually more or less saturate the ground below, and so downward heat losses will eventually tend toward zero. Heat leaking upward would passively heat said structure at night and on cloudy days. In sum, pumping excess solar heat through this embodiment in cold weather seasons will preserve much of the excess heat for a period of many days or weeks in the many tons of ground under the center of the structure, passively moderating the structure's indoor temperature through considerable outside swings in winter temperature. Isothermal lines (284) illustrate the leakage of heat through the ground.

In the embodiment shown in FIG. 29, hot daytime air in a structure (294) is driven through tubes (295) by a fan (296) from the top of a structure (297) down into pipes (298) sunk deep into the ground below the center of said structure (299). These tubes run nearly all the way to the bottom of the pipes. Air driven to the bottom of the pipes returns up the pipes and outside of the tubes (300). The pipes are sealed against leakage on their lower ends and have sharp points (301) for easy insertion into the ground, either with well drilling equipment or by pounding them into the ground.

The heat in the air is transferred to the pipe walls, and then to the soil. Heat leaks to the outside. Isothermal lines illustrate typical heat leakage. At night, heat leaks back through the pipe walls to heat the air in the pipe, which is blown back up the pipe to heat the structure. In this embodiment a much greater amount of active geothermal heat storage may take place, as compared to the embodiment shown in FIG. 29.

The embodiment shown in FIG. 29 doesn't have as efficient an air flow scheme as does FIG. 28. To partially compensate for slow heating and cooling response, one or more water barrels (302) absorbs daytime heat inside the structure. The water barrels absorb and release heat relatively quickly, reducing the structure's high heat gradient between inside and outside temperatures on sunny days, and giving a ground-based passive heat storage system time to catch up at night. During prolonged heatless periods, the pipe walls transmit heat stored deep under the soil up to ground level.

The long-term heat storage mechanism in this embodiment can handle seasonal and weekly hot and cold fluctuations with the aid of a weather forecasting service. In late spring and during summer heat, hot daytime air can be vented to the outside, and colder night air can be sent down the pipes each night, cooling the ground and providing a measure of air conditioning to the structure. In fall, heat may be banked for winter.

In any particular situation, an economic balance can be reached between gathering excess concentrated heat from sunshine, insulating a structure to limit heat losses, storing great quantities of excess heat in the ground, insulating the ground around a structure, losing heat from a geothermal heat bank to the outside, maintaining a desired temperature inside, and using backup power. For most crops, greenhouses have a moderate tolerance of temperature fluctuations inside, and an economic balance can be reached easily. Buildings in which people live or work have tighter standards, but these tighter standards can equally be met by concentrating sunlight and by using geothermal heat storage. The combination of concentrated solar heat inputs and geothermal heat storage can also be applied to solar thermal electricity generation.

Although said invention has been described with respect to various embodiments, it should be realized this invention is also capable of a wide variety of further and other embodiments.

What is claimed is:

1. A structure optimized for solar daylighting or for solar heating comprising a linear trough located free standing above a ground surface that faces generally south, a window inset or overhang above a line of target windows which shields the windows from rain or snow and may serve as part of the structure's roof without substantially blocking sun's rays from the roof at the winter solstice, and a solar heated structure wherein a bottom of the line of target windows is located at least five feet above the ground as measured on the structure's outside and is located at least five feet above the ground as measured on the structure's inside, so as to avoid shining concentrated sunlight from the trough on small children and animals that may be near the target windows inside the structure or outside of the structure, the linear trough being covered with a water-impervious reflector surface in a shingled arrangement such that the bottom edge of each row of reflectors overlaps one or more lower reflector surfaces to prevent the incursion of water from rain and melting snow and ice behind horizon-facing or upward-facing reflector surfaces, and the linear trough further having at least two adjacently-mounted reflector surfaces on a substrate for support with one or more holes in a gap between the reflector surfaces to relieve wind pressure on the reflector surface and the linear trough having a linear trough with one or more reflector sections pivoting around a horizontal axis for seasonal refocusing.

2. A structure as in claim 1 wherein the reflector has two or more multi-row sections stacked one above the other forming a roughly parabolic linear trough with higher and lower levels that may be individually refocused to compensate for the change in seasonal sun angle.

3. A structure as in claim 1 wherein the linear trough is roughly one to ten feet wider than the its target window at one or more ends, with the troughs' protruding ends tipped inward between five and thirty degrees, where in use, at maximum close to twice as much sunlight flows through any specific point on the ends of the line of target windows as would flow through them without the extended ends.

4. A structure as in claim 1 wherein the linear trough has one or more reflector sections pivoting around a horizontal axis for seasonal refocusing with one or more release catches attached to each section wherein the release catches will also release one end of the reflector section to pivot on its horizontal axis to relieve pressure on the reflector in high wind gusts.

5. A structure as in claim 1 wherein the linear trough with bidirectional catches that release under wind pressure and restrain the trough when they swing back into place.

6. A structure as in claim 5 wherein the linear trough has bidirectional catches that will restrain panels when they swing back into place gently but will let a violently swinging panel pass by the point of restraint thereby avoiding damage to violently swinging panels and their supporting framework.

7. A structure as in claim 1 wherein the linear trough with a framework that rotates in a same plane as its constituent sections allowing the horizontal orientation of the trough as a whole to be independent of the horizontal orientation of the individual sections.

\* \* \* \* \*